United States Patent
Nakagawa et al.

(10) Patent No.: US 8,384,152 B2
(45) Date of Patent: Feb. 26, 2013

(54) SEMICONDUCTOR DEVICE HAVING TRENCH GATE VDMOSFET AND METHOD OF MANUFACTURING THE SAME

(75) Inventors: Yoshikazu Nakagawa, Kyoto (JP); Naoki Izumi, Kyoto (JP); Masaki Nagata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 500 days.

(21) Appl. No.: 12/232,582

(22) Filed: Sep. 19, 2008

(65) Prior Publication Data

US 2009/0078995 A1    Mar. 26, 2009

(30) Foreign Application Priority Data

Sep. 20, 2007  (JP) ................................. 2007-244408
Sep. 20, 2007  (JP) ................................. 2007-244409
Aug. 28, 2008  (JP) ................................. 2008-220323

(51) Int. Cl.
*H01L 29/66* (2006.01)
(52) U.S. Cl. ........ 257/330; 257/332; 257/333; 438/270; 438/273; 438/259
(58) Field of Classification Search .................. 257/330, 257/288, 401, 901, 332, 333, 334, 339, 329, 257/395, 396, 397, 406, 622, E27.091, E27.092, 257/301, 302, 303, 304, 306, 342, 331; 438/270, 438/292, 293, 294, 295, 296, 297, 298, 300, 438/301, 302, 303, 304, 305, 306, 307, 308, 438/268, 257, 259, 272, 427, 700, 271, 273, 438/274, 243, 244, 386, 387
See application file for complete search history.

(56) References Cited

U.S. PATENT DOCUMENTS

| | | | |
|---|---|---|---|
| 6,784,488 B2 * | 8/2004 | Huang et al. .................. | 257/330 |
| 7,763,513 B2 * | 7/2010 | Wang et al. .................... | 438/259 |
| 2001/0008291 A1 * | 7/2001 | Aoki et al. ..................... | 257/330 |
| 2008/0012026 A1 * | 1/2008 | Tsuji .............................. | 257/77 |

FOREIGN PATENT DOCUMENTS

JP    11-274484    10/1999

* cited by examiner

*Primary Examiner* — Ha Tran T Nguyen
*Assistant Examiner* — Thanh Y Tran
(74) *Attorney, Agent, or Firm* — Rabin & Berdo, P.C.

(57) ABSTRACT

A semiconductor device includes a first conductivity type layer of a first conductivity type, a body layer of a second conductivity type formed on the first conductivity type layer, a gate trench passing through the body layer so that the deepest portion thereof reaches the first conductivity type layer, a source region of the first conductivity type formed around the gate trench on the surface layer portion of the body layer, a gate insulating film formed on the bottom surface and the side surface of the gate trench, and a gate electrode embedded in the gate trench through the gate insulating film, and the bottom surface of the gate electrode and the upper surface of the first conductivity type layer are flush with each other.

7 Claims, 26 Drawing Sheets

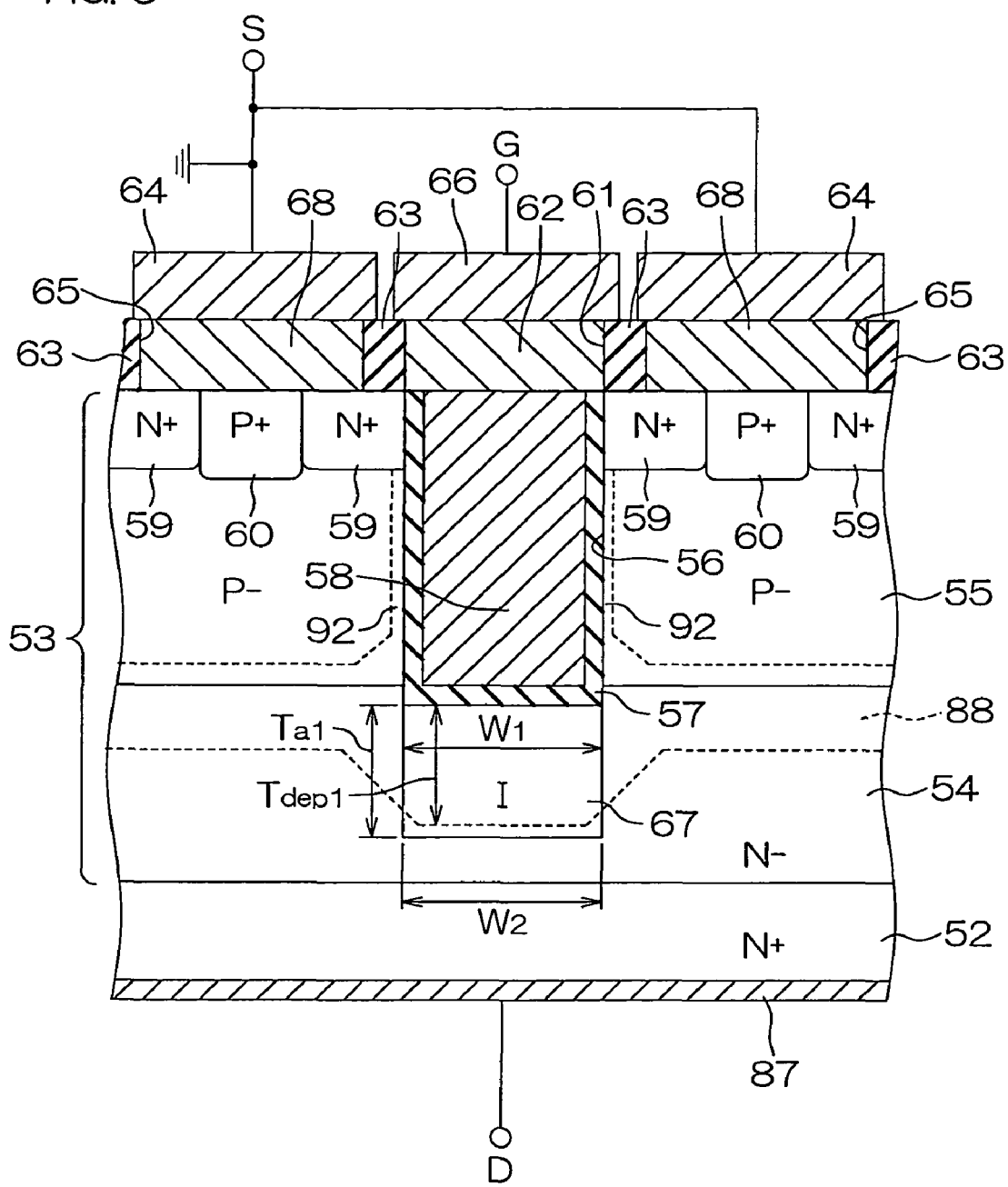

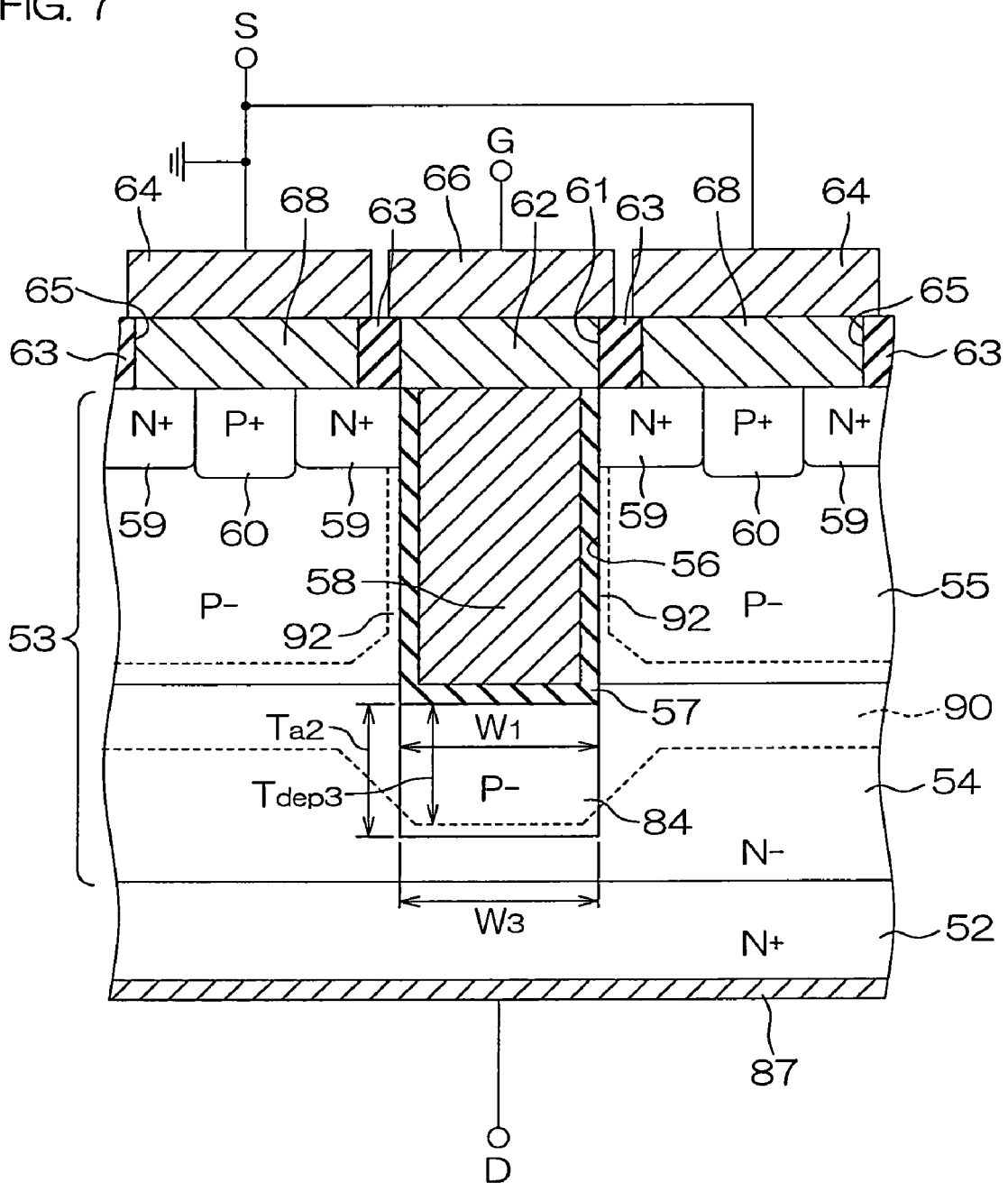

SEMICONDUCTOR DEVICE HAVING TRENCH GATE VDMOSFET AND METHOD OF MANUFACTURING THE SAME

BACKGROUND OF THE INVENTION

1. Field of the Invention

The present invention relates to a semiconductor device having a trench gate VDMOSFET and a method of manufacturing a semiconductor device.

2. Description of Related Art

A trench gate structure is generally known as a structure effective for refinement of a VDMOSFET (Vertical Double diffused Metal Oxide Semiconductor Field-Effect Transistor).

FIG. 9 is a schematic sectional view of a conventional semiconductor device 100 having a trench gate VDMOSFET.

The semiconductor device 100 includes an $N^+$-type substrate 101. An $N^-$-type epitaxial layer 102 is laminated on the $N^+$-type substrate 101. The base layer portion of the $N^-$-type epitaxial layer 102 forms an $N^-$-type region 103, while a $P^-$-type body region 104 is formed on the surface layer portion of the $N^-$-type epitaxial layer 102 vertically adjacently to the $N^-$-type region 103.

A gate trench 105 is dug in the $N^-$-type epitaxial layer 102 from the surface thereof. The gate trench 105 passes through the $P^-$-type body region 104, so that the deepest portion thereof reaches the $N^-$-type region 103. A gate electrode 107 made of polysilicon doped with an N-type impurity in a high concentration is embedded in the gate trench 105 through a gate insulating film 106 made of $SiO_2$ (silicon oxide).

An $N^+$-type source region 108 is formed on the surface layer portion of the $P^-$-type body region 104 along the gate trench 105. A $P^+$-type contact region 109 is formed at the center of the $N^+$-type source region 108 in plan view, to pass through the $N^+$-type source region 108.

An interlayer dielectric film 110 is laminated on the $N^-$-type epitaxial layer 102. A source wire 111 is formed on the interlayer dielectric film 110. This source wire 111 is grounded. The source wire 111 is in contact (electrically connected) with the $N^+$-type source region 108 and the $P^+$-type contact region 109 through a contact hole 112 formed in the interlayer dielectric film 110. A gate wire 113 is electrically connected to the gate electrode 107 through another contact hole (not shown) formed in the interlayer dielectric film 110.

A drain electrode 114 is formed on the back surface of the $N^+$-type substrate 101.

A current can be fed between the $N^+$-type source region 108 and the drain electrode 114 by controlling the potential of the gate electrode 107 while applying a positive voltage of a proper level to the drain electrode 114 thereby forming a channel in a portion (channel forming region 116) of the $P^-$-type body region 104 close to the interface between the same and the gate insulating film 106. Thus, a switching operation of the VDMOSFET is achieved.

For example, the product $R_{on} \cdot Q_g$ of the on-resistance $R_{on}$ and the gate charge quantity $Q_g$ of the VDMOSFET is employed as an index of the switching performance of the VDMOSFET, and the semiconductor device can achieve the switching operation at a higher speed as the product $R_{on} \cdot Q_g$ is reduced.

In the semiconductor device 100 shown in FIG. 9, the on-resistance $R_{on3}$ of the VDMOSFET corresponds to resistance between the source wire 111 and the drain electrode 114, such as combined resistance of channel resistance $R_{ch2}$ in the channel forming region 116 and epi-resistance $R_{epi2}$ in the $N^-$-type region 103, for example.

On the other hand, the gate charge quantity $Q_{g3}$ of the VDMOSFET corresponds to the quantity of charges stored in a gate capacitance $C_{g3}$ (combined capacitance of the capacitance $C_{ox4}$ of the gate insulating film 106 held between the gate electrode 107 and the portion of the $N^-$-type region 103 on the bottom surface and the side surface of the gate trench 105, the capacitance $C_{ox5}$ of the gate insulating film 106 held between the gate electrode 107 and the $N^+$-type source region 108 and the capacitance $C_{dep3}$ of a depletion layer 115 spreading from the interface between the $N^-$-type region 103 and the $P^-$-type body region 104). In the semiconductor device 100, a high-speed switching operation of the VDMOSFET can be achieved if the product $R_{on3} \cdot C_{g3}$ can be reduced.

As shown in FIG. 10, however, the on-resistance $R_{on3}$ and the gate capacitance $Q_{g3}$ are in the so-called trade-off relation, such that the former is increased when the latter is reduced and vice versa. In order to reduce the product $R_{on3} \cdot Q_{g3}$, therefore, one of the on-resistance $R_{on3}$ and the gate capacitance $Q_{g3}$ must be reduced, while preventing increase of the other.

The on-resistance $R_{on3}$ of the semiconductor device 100 can be reduced by reducing either the channel resistance $R_{ch2}$ or the epi-resistance $R_{epi2}$.

In order to reduce the on-resistance $R_{on3}$, the thickness of the gate insulating film 106 may be reduced, for example. If the thickness of the gate insulating film 106 is reduced, however, a voltage exceeding the withstand voltage of the gate insulating film 106 may be applied between the gate and the drain upon voltage application to the drain electrode 114, to result in dielectric breakdown of the gate insulating film 106. In order to prevent such dielectric breakdown, the thickness of the gate insulating film 106 cannot be reduced below a certain level, and hence the on-resistance $R_{on3}$ of the semiconductor device 100 cannot be sufficiently reduced. Therefore, it has been difficult to prepare a low-voltage semiconductor device drivable at a low voltage.

SUMMARY OF THE INVENTION

An object of the present invention is to provide a semiconductor device capable of reducing a gate charge quantity without increasing on-resistance and a method of manufacturing the same.

Another object of the present invention is to provide a semiconductor device capable of reducing on-resistance and a method of manufacturing the same.

A semiconductor device according to one aspect of the present invention includes: a first conductivity type layer of a first conductivity type; a body layer of a second conductivity type formed on the first conductivity type layer; a gate trench passing through the body layer so that the deepest portion thereof reaches the first conductivity type layer; a source region of the first conductivity type formed around the gate trench on the surface layer portion of the body layer; a gate insulating film formed on the bottom surface and the side surface of the gate trench; and a gate electrode embedded in the gate trench through the gate insulating film, wherein the bottom surface of the gate electrode and the upper surface of the first conductivity type layer are flush with each other.

According to this structure, the gate insulating film is formed on the bottom surface and the side surface of the gate trench having the deepest portion reaching the first conductivity type layer. The gate electrode is embedded in the gate trench through the gate insulating film. The bottom surface of the gate electrode is flush with the upper surface of the first conductivity type layer.

The bottom surface of the gate electrode and the upper surface of the first conductivity type layer are flush with each other, whereby the gate electrode is opposed to the first conductivity type layer only through the portion of the gate insulating film located on the bottom surface of the gate trench, and not through the portion of the gate insulating film located on the side surface of the gate trench. Therefore, the opposed areas of the gate electrode and the first conductivity type layer can be reduced as compared with a structure (see FIG. 9) having a gate electrode opposed to a first conductivity type region through a gate insulating film formed on the bottom surface and the side surface of a gate trench.

Therefore, a parasitic capacitance formed between the gate electrode and the first conductivity type layer can be reduced. Consequently, the gate capacitance can be reduced, thereby reducing the gate charge quantity.

According to the structure that the bottom surface of the gate electrode and the upper surface of the first conductivity type layer are flush with each other, the on-resistance of the semiconductor device remains unincreased. In other words, the gate charge quantity can be reduced without increasing the on-resistance according to the aforementioned structure.

The semiconductor device having this structure can be obtained by a method of manufacturing a semiconductor device according to another aspect of the present invention. In other words, the semiconductor device can be obtained by a method of manufacturing a semiconductor device, including the steps of: forming an insulating layer having a prescribed pattern on one surface of a first semiconductor layer of a first conductivity type; growing a second semiconductor layer of the first conductivity type on an exposed surface of the first semiconductor layer; growing a body layer of a second conductivity type on the second semiconductor layer; forming a source region of the first conductivity type by introducing an impurity of the first conductivity type into the periphery of the insulating layer from the surface of the body layer; forming a trench by removing the insulating layer until the upper surface of the insulating layer is flush with the upper surface of the second semiconductor layer while leaving a bottom portion of the insulating layer as a part of a gate insulating film; forming an oxide film constituting the gate insulating film along with the bottom portion of the insulating layer by oxidizing the surface of the body layer including the side surface of the trench; and forming a gate electrode on the gate insulating film to fill up the trench.

Preferably, the thickness of a portion of the gate insulating film covering the bottom surface of the gate trench is larger than the thickness of a portion opposed to the body layer on the side surface of the gate trench.

A trench gate semiconductor device is driven by applying a prescribed voltage (gate threshold voltage) to a gate electrode and forming a channel in a portion (channel forming region) of a body layer on the side surface of a gate trench close to the interface between the same and an insulating film.

For example, the thickness of a gate insulating film may be so uniformly increased as to increase the distance between the gate electrode and the gate trench, thereby reducing a parasitic capacitance formed therebetween. If the thickness of the gate insulating film opposed to the channel forming region is increased, however, the on-resistance may be increased.

If the thickness of the portion of the gate trench opposed to the body layer is set to a proper level and only the thickness of the portion of the gate insulating film covering the bottom surface of the gate trench is increased, the parasitic capacitance formed between the gate electrode and the bottom surface of the gate trench (first conductivity type layer) can be reduced without increasing the on-resistance of the semiconductor device. Therefore, the gate capacitance can be further reduced, and the gate charge quantity can also be further reduced. Consequently, the semiconductor device can achieve a switching operation at a higher speed.

Preferably, the thickness of a portion of the gate insulating film adjacent to the source region is larger than the thickness of a portion opposed to a body region of the body layer excluding the source region on the side surface of the gate trench.

When the thickness of the portion of the gate insulating film adjacent to the source region is larger than the thickness of the portion opposed to the body region on the side surface of the gate trench, the parasitic capacitance formed between the gate electrode and the source region can be reduced without increasing the on-resistance of the semiconductor device. Therefore, the gate capacitance can be further reduced, and the gate charge quantity can also be further reduced. Consequently, the semiconductor device can achieve the switching operation at a higher speed.

Preferably, a portion of the first conductivity type layer reaching an intermediate portion of the first conductivity type layer along the thickness direction from the bottom surface of the gate trench contains a second conductivity type impurity.

According to this structure, the portion of the first conductivity type layer reaching the intermediate portion of the first conductivity type layer along the thickness direction from the bottom surface of the gate trench contains the second conductivity type impurity, whereby the thickness (extension in the thickness direction of the first conductivity type layer) of a depletion layer spreading below the gate trench from the interface between the first conductivity type layer and the body layer can be increased. Therefore, the parasitic capacitance of this depletion layer can be reduced, and the withstand voltage of the semiconductor device can be improved.

The semiconductor device having this structure can be obtained by a method of manufacturing a semiconductor device according to still another aspect of the present invention. In other words, the semiconductor device can be obtained by a method of manufacturing a semiconductor device including the steps of: forming an insulating layer having a prescribed pattern on one surface of a first semiconductor layer of a first conductivity type; growing a second semiconductor layer of the first conductivity type on an exposed surface of the first semiconductor layer; growing a body layer of a second conductivity type on the second semiconductor layer; forming a source region of the first conductivity type by introducing an impurity of the first conductivity type into the periphery of the insulating layer from the surface of the body layer; forming a gate trench passing through the body layer so that the deepest portion thereof reaches the first semiconductor layer by removing the insulating layer; introducing an impurity of the second conductivity type into the first semiconductor layer from the bottom surface of the gate trench; forming a gate insulating film having an upper surface flush with the upper surface of the second semiconductor layer in the gate trench by oxidizing the bottom surface and the side surface of the gate trench and the upper surface of the body layer; and forming a gate electrode on the gate insulating film to fill up the gate trench.

Preferably, a bottom portion of the gate insulating film in contact with the first conductivity type layer on the bottom surface and the side surface of the gate trench has a two-layer structure formed by successively laminating a lower layer film made of silicon oxide and an upper layer film made of silicon nitride.

A semiconductor device according to a further aspect of the present invention includes: a semiconductor layer; a first conductivity type region of a first conductivity type, containing a first conductivity type impurity, formed on the base layer portion of the semiconductor layer; a body region of a second conductivity type formed on the semiconductor layer in contact with the first conductivity type region; a trench formed in the semiconductor layer to pass through the body region so that the deepest portion thereof reaches the first conductivity type region; a source region of the first conductivity type formed around the trench on the surface layer portion of the semiconductor layer in contact with the body region; a gate insulating film formed on the bottom surface and the side surface of the trench; and a gate electrode embedded in the trench through the gate insulating film, wherein a portion of the first conductivity type region reaching an intermediate portion of the first conductivity type region along the thickness direction from the bottom surface of the trench is a low-concentration region having a lower first conductivity type impurity concentration than the remaining portion of the first conductivity type region.

According to this structure, the trench passing through the body region so that the deepest portion thereof reaches the first conductivity type region is formed in the semiconductor layer. The gate insulating film is formed on the bottom surface and the side surface of the trench, and the gate electrode is embedded in the trench through this gate insulating film.

In the first conductivity type region, the portion reaching the intermediate portion of the first conductivity type region along the thickness direction from the bottom surface of the trench is the low-concentration region having a lower first conductivity type impurity concentration than the remaining portion of the first conductivity type region.

Therefore, the thickness of a depletion layer spreading below the trench from the interface between the first conductivity type region and the body region along the thickness direction of the first conductivity type region can be increased as compared with a conventional structure (see FIG. 9, for example) provided with a first conductivity type region having a uniform first conductivity type (N-type, for example) impurity concentration under a trench.

A gate-to-drain voltage applied to the gate insulating film can be reduced by increasing the thickness of the depletion layer. Consequently, the thickness of the gate insulating film can be reduced, thereby reducing the on-resistance of the semiconductor device.

The low-concentration region may be an intrinsic semiconductor region containing no first conductivity type impurity, or may contain a second conductivity type impurity, for example, so far as the first conductivity type impurity concentration thereof is lower than that of the remaining portion of the first conductivity type region. In particular, the low-concentration impurity region preferably contains the second conductivity type impurity, so that the depletion layer is formed on the interface between the first conductivity type region and the low-concentration region.

The semiconductor device having the aforementioned structure can be obtained by a method of manufacturing a semiconductor device according to a further aspect of the present invention. In other words, the semiconductor device can be obtained by a method of manufacturing a semiconductor device, including the steps of: forming a trench on a semiconductor layer of a first conductivity type; embedding a semiconductor material having a first conductivity type impurity concentration lower than the first conductivity type impurity concentration of the semiconductor layer in a bottom portion of the trench; forming an oxide film by oxidizing the surface of the semiconductor layer including the side surface of the trench and the surface of the semiconductor material; forming a gate electrode on the oxide film to fill up the trench; forming a body region of a second conductivity type by introducing an impurity of the second conductivity type from the surface of the semiconductor layer; forming a source region of the first conductivity type in contact with the body region by introducing an impurity of the first conductivity type into the periphery of the trench from the surface of the semiconductor layer; and forming a gate insulating film on the bottom surface and the side surface of the trench by removing a portion of the oxide film other than the trench.

Preferably, the thickness of a portion of the gate insulating film adjacent to the source region is larger than the thickness of a portion opposed to the body region on the side surface of the trench.

When the thickness of the portion of the gate insulating film adjacent to the source region is larger than the thickness of the portion opposed to the body region on the side surface of the trench, the parasitic capacitance formed between the gate electrode and the source region can be reduced without increasing the on-resistance of the semiconductor device. Therefore, the gate capacitance can be further reduced, and the gate charge quantity can also be further reduced. Consequently, the semiconductor device can achieve the switching operation at a higher speed.

BRIEF DESCRIPTION OF THE DRAWINGS

FIG. 5 is a schematic sectional view of a semiconductor device according to a third embodiment of the present invention.

FIG. 7 is a schematic sectional view of a semiconductor device according to a fourth embodiment of the present invention.

DETAILED DESCRIPTION OF THE INVENTION

Figure 1:
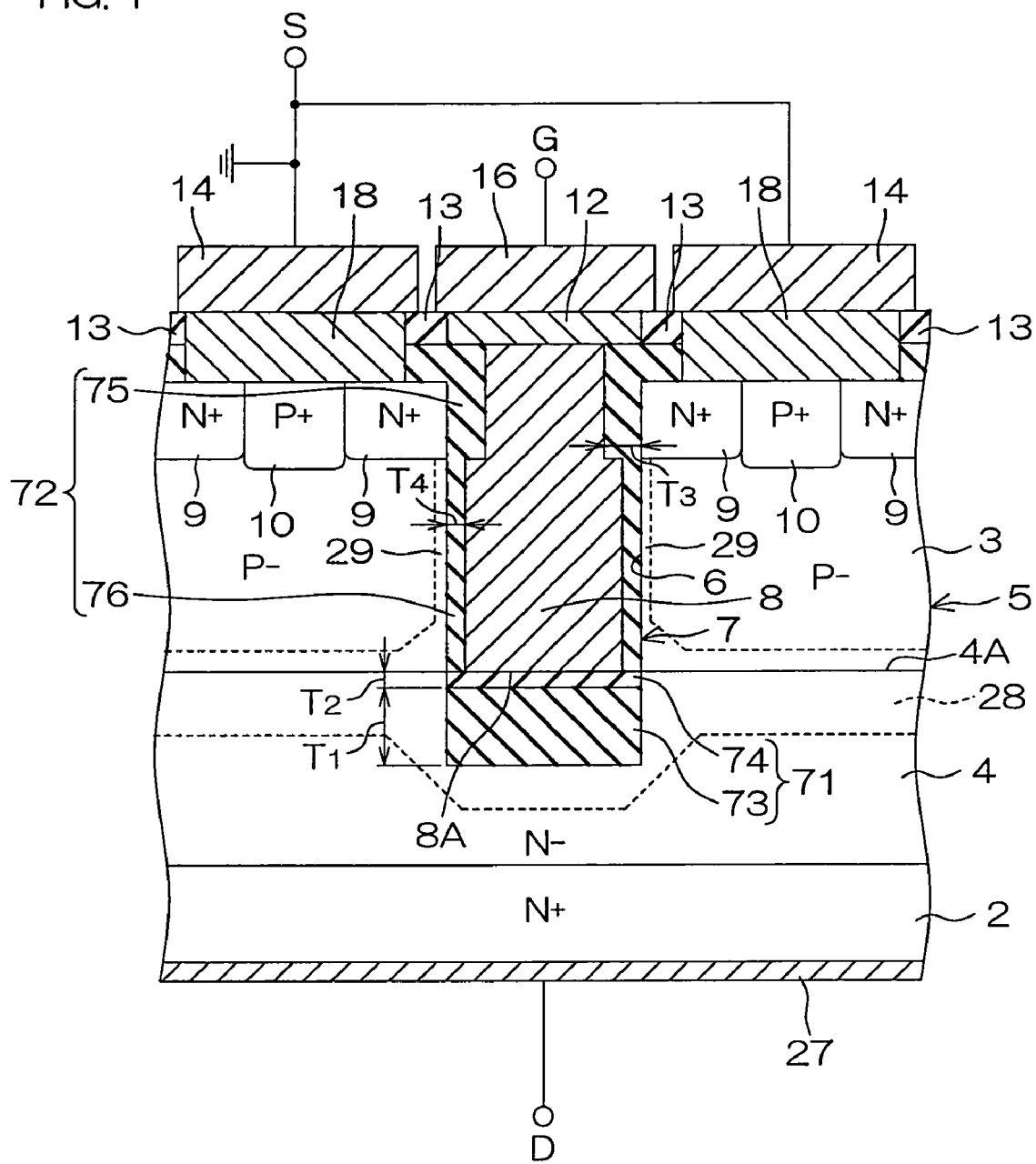
FIG. 1 is a schematic sectional view of a semiconductor device according to a first embodiment of the present invention.

FIG. 1 is a schematic sectional view of a semiconductor device 1 according to a first embodiment of the present invention.

The semiconductor device 1 has an array structure formed by arranging unit cells having trench gate VDMOSFETS in the form of a matrix.

On an $N^+$-type substrate 2 forming the base of the semiconductor device 1, an $N^-$-type layer 4 made of Si (silicon) doped with an N-type impurity (P (phosphorus), for example)

in a lower concentration ($10^{15}$ cm$^{-3}$, for example) than the N$^+$-type substrate 2 is laminated. A P$^-$-type body region 5 is laminated on the N$^-$-type layer 4.

A gate trench 6 is dug in the semiconductor device 1 from the surface of the body layer 5. The gate trench 6 passes through the body layer 5, so that the deepest portion thereof reaches the N$^-$-type layer 4. A plurality of such gate trenches 6 are formed at regular intervals along the horizontal direction in FIG. 1, to extend in a direction (along the gate widths) perpendicular to the plane of FIG. 1 respectively. A gate insulating film 7 is formed on the inner surface of each gate trench 6 and the upper surface of the body layer 5, to cover the overall regions of the gate trench 6 and the body layer 5.

The gate insulating film 7 has a bottom portion 71 and an upper portion 72.

The bottom portion 71 is in contact with the N$^-$-type layer 4 on the bottom surface and the side surfaces of the gate trench 6, and has a two-layer structure obtained by successively laminating a lower layer film 73 made of SiO$_2$ (silicon oxide) and an upper layer film 74 made of SiN (silicon nitride). The lower layer film 73 has a thickness $T_1$ of 1 μm to 10 μm, for example, and the upper layer film 74 has a thickness $T_2$ of 0.05 μm to 0.2 μm, for example. The upper surface of the upper layer film 74 (upper surface of the bottom portion 71) is flush with the upper surface 4A of the N$^-$-type layer 4 (interface between the N$^-$-type layer 4 and the body layer 5).

The upper portion 72 has a source region opposed portion 75 opposed to a source region 9 described later and a body region opposed portion 76 opposed to a body region 3 of the body layer 5 excluding the source region 9. The source region opposed portion 75 has a thickness $T_3$ of 0.06 μm to 0.1 μm, for example, and the body region opposed portion 76 has a thickness $T_4$ of 0.04 μm to 0.06 μm, for example.

A gate electrode 8 is embedded in the gate trench 6 by filling up the inner side of the gate insulating film 7 in the gate trench 6 with polysilicon doped with an N-type impurity (P (phosphorus), for example) in a high concentration. The gate electrode 8 has a bottom surface 8A in contact with the upper surface of the upper layer film 74 (upper surface of the bottom portion 71). In other words, the bottom surface 8A of the gate electrode 8 is flush with the upper surface 4A of the N$^-$-type layer 4.

On the surface layer portion of the body layer 5, the source region 9 of the N$^+$-type having a higher N-type impurity concentration ($10^{19}$ cm$^{-3}$ to $10^{21}$ cm$^{-3}$, for example) than the N$^-$-type layer 4 is formed on each side of the gate trench 6 in the direction (horizontal direction in FIG. 1) orthogonal to the gate width 6.

The source region 9 extends along the gate trench 6 in the direction along the gate width, so that the bottom portion thereof is in contact with the body region 3 of the body layer 5. A P$^+$-type source contact region 10 is formed at the center of the source region 9 in the direction orthogonal to the gate width, to pass through the source region 9.

In other words, gate trenches 6 and source regions 9 are alternately provided in the direction orthogonal to the gate widths, to extend in the direction along the gate widths respectively. The boundaries between the unit cells adjacent to one another in the direction orthogonal to the gate widths are set on the source regions 9, along the source regions 9. At least one or more source contact regions 10 are provided over each pair of unit cells adjacent to each other in the direction orthogonal to the gate widths. The boundaries between the unit cells adjacent to one another in the direction along the gate widths are so set that the gate electrode 8 included in each unit cell has a constant gate width.

An interlayer dielectric film 13 is laminated on the body layer 5 through the gate insulating film 7. A source wire 14 is formed on the interlayer dielectric film 13. This source wire 14 is grounded. The source wire 14 is in contact (electrically connected) with the source region 9 and the source contact region 10 through a source plug 18 provided through the interlayer dielectric film 13 and the gate insulating film 7.

A gate wire 16 is formed on the interlayer dielectric film 13. The gate wire 16 is in contact (electrically connected) with the gate electrode 8 through a gate plug 12 provided through the interlayer dielectric film 13 and the gate insulating film 7.

A drain electrode 27 is formed on the back surface of the N$^+$-type substrate 2.

A current can be fed between the source region 9 and the drain electrode 27 by controlling the potential of the gate electrode 8 while applying a positive voltage of a proper level to the drain electrode 27 thereby forming a channel in a portion (channel forming region 29) of the body region 3 close to the interface between the same and the gate insulating film 7.

In this semiconductor device 1, the bottom surface 8A of the gate electrode 8 and the upper surface 4A of the N$^-$-type layer 4 are flush with each other. Therefore, the gate electrode 8 is opposed to the N$^-$-type layer 4 only through the bottom portion 71 of the gate insulating film 7, and not through the portion (upper portion 72) of the gate insulating film 7 located on the side surfaces of the gate trench 6.

Figure 9:
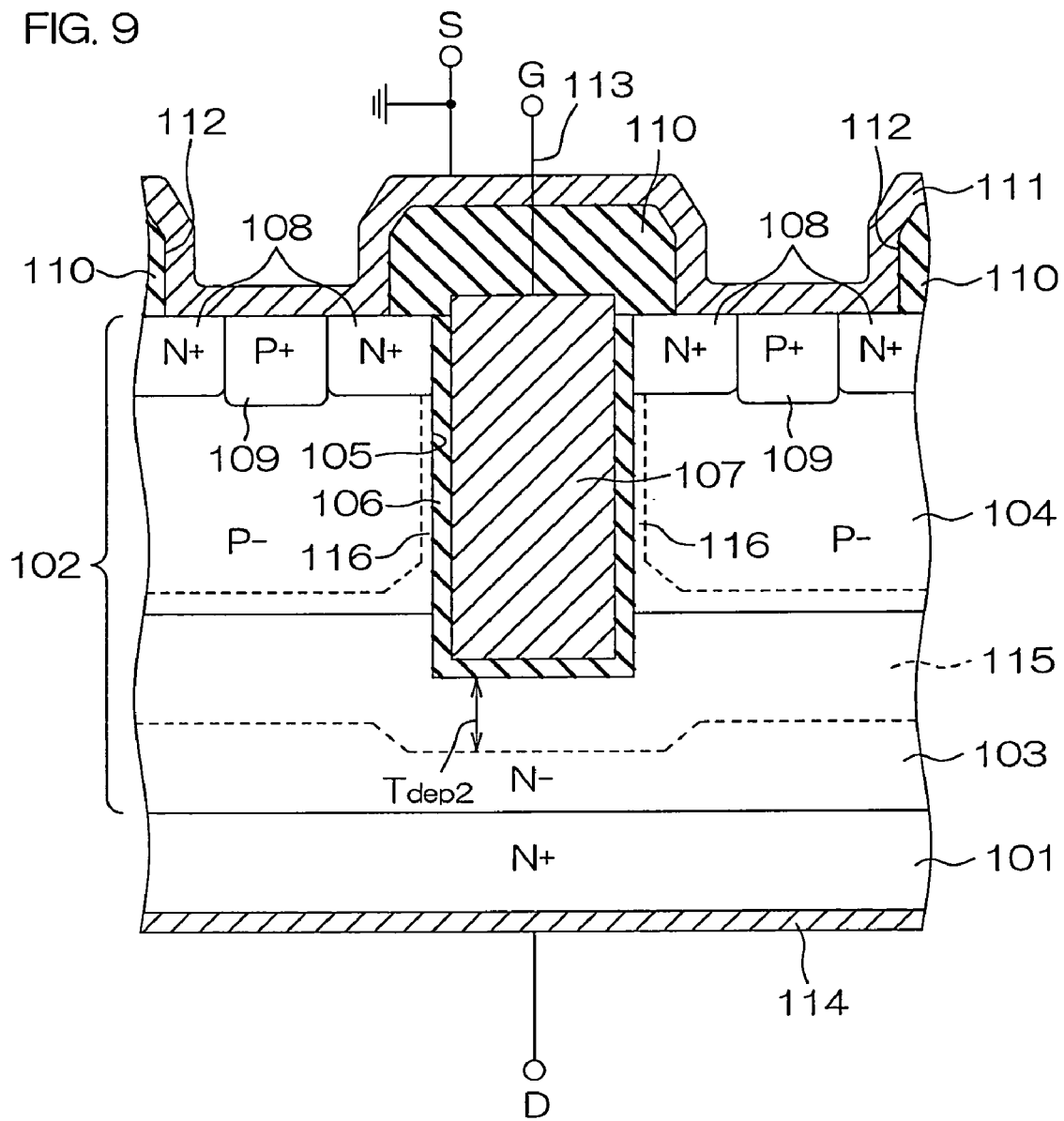
FIG. 9 is a schematic sectional view of a conventional semiconductor device having a trench gate VDMOSFET.
Figure 10:
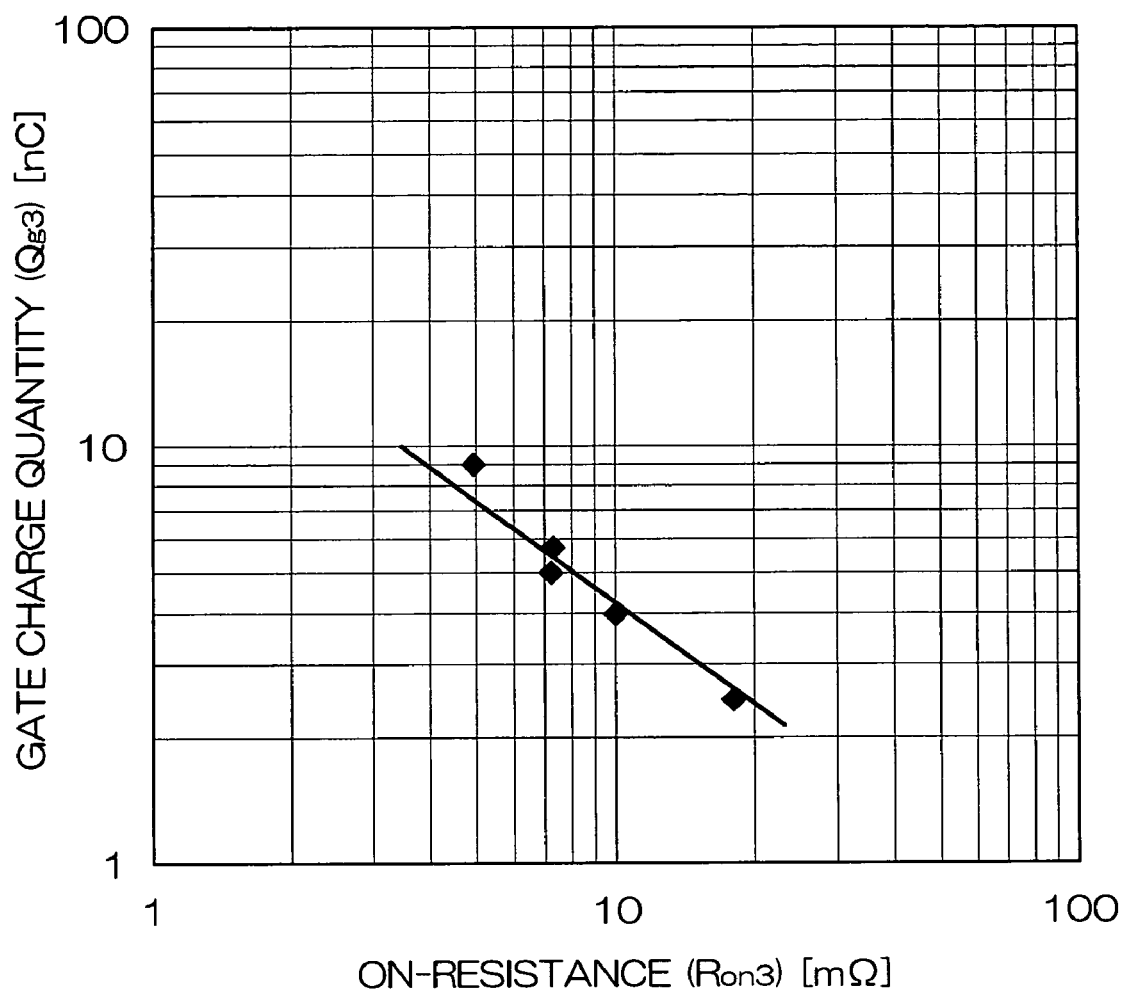
FIG. 10 is a graph showing the relation between the on-resistance $R_{on3}$ and the gate charge quantity $Q_{g3}$ of the VDMOSFET shown in FIG. 9.

Therefore, the opposed areas of the gate electrode and the N$^-$-type layer 4 can be more reduced as compared with the semiconductor device 100 shown in FIG. 9 having the gate electrode 107 opposed to the N$^-$-type region 103 through the gate insulating film 106 on the bottom surface and the side surfaces of the gate trench 105. Thus, a parasitic capacitance $C_{ox1}$ formed between the gate electrode 8 and the N$^-$-type layer 4 can be reduced.

The gate capacitance $C_{g1}$ of the semiconductor device is expressed by a combined capacitance of the parasitic capacitance $C_{ox1}$, a parasitic capacitance $C_{dep1}$ of a depletion layer 28 spreading from the interface between the N$^-$-type layer 4 and the body region 3 and a parasitic capacitance $C_{ox2}$ described later. Therefore, the gate capacitance $C_{g1}$ can be reduced by reducing the parasitic capacitance $C_{ox1}$ whereby the gate charge quantity $Q_{g1}$ can be reduced as a result.

Further, the bottom surface 8A of the gate electrode 8 and upper surface 4A of the N$^-$-type layer 4 are flush with each other, whereby the on-resistance $R_{on1}$ of the semiconductor device 1 remains unincreased. In other words, the gate charge quantity $Q_{g1}$ can be reduced without increasing the on-resistance $R_{on1}$ in the structure of the semiconductor device 1.

In this semiconductor device 1, the bottom portion 71 of the gate insulating film 7 has a thickness $T_1+T_2$ of 1.05 μm to 10.2 μm, for example, which is larger than the thickness $T_4$ (0.04 μm to 0.06 μm, for example) of the body region opposed portion 76.

As hereinabove described, the trench gate semiconductor device 1 is driven by applying a prescribed voltage (gate threshold voltage) to the gate electrode 8 and forming a channel on the channel forming region 29.

For example, the thickness of the gate insulating film 7 may conceivably be uniformly increased to increase the distance between the gate electrode 8 and the bottom surface of the gate trench 6, thereby reducing a parasitic capacitance formed therebetween. If the thickness of the gate insulating film 7 (body region opposed portion 76) opposed to the channel forming region 29 is increased, however, the on-resistance $R_{on1}$ may be increased.

In the semiconductor device 1, however, the parasitic capacitance $C_{ox1}$ formed between the gate electrode 8 and the N⁻-type layer 4 can be further reduced without increasing the on-resistance $R_{on1}$, by properly setting the thickness $T_4$ of the body region opposed portion 76 and increasing only the thickness $T_1+T_2$ of the bottom portion 71. Consequently, the gate capacitance $C_{g1}$ can be further reduced, and the gate charge quantity $Q_{g1}$ can also be further reduced.

In this semiconductor device 1, further, the thickness $T_3$ of the source region opposed portion 75 is also larger than the thickness $T_4$ of the body region opposed portion 76. Therefore, the parasitic capacitance $C_{ox2}$ formed between the gate electrode 8 and the source region 9 can also be reduced without increasing the on-resistance $R_{on1}$ by increasing only the thickness $T_3$ of the source region opposed portion 75, thereby further reducing the gate charge quantity $Q_{g1}$.

Consequently, the semiconductor device 1 can achieve a switching operation at a higher speed.

FIGS. 2A to 2J are sectional views successively showing the steps of manufacturing the semiconductor device 1.

Figure 2A:
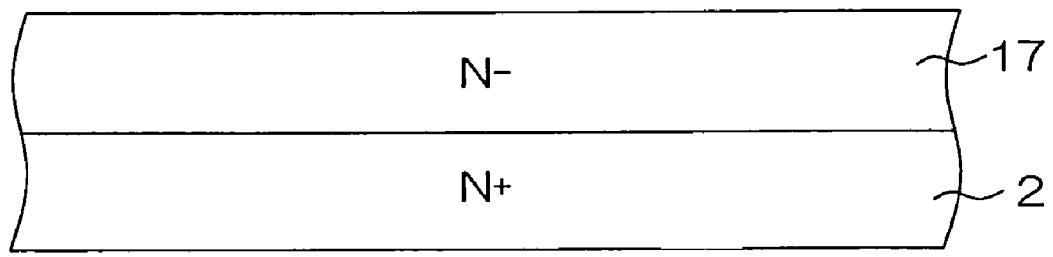
FIGS. 2A to 2J are sectional views successively showing the steps of manufacturing the semiconductor device shown in FIG. 1.

First, an N⁻-type layer 17 (first semiconductor layer) is formed on the N⁺-type substrate 2 by epitaxy, as shown in FIG. 2A.

Figure 2B:
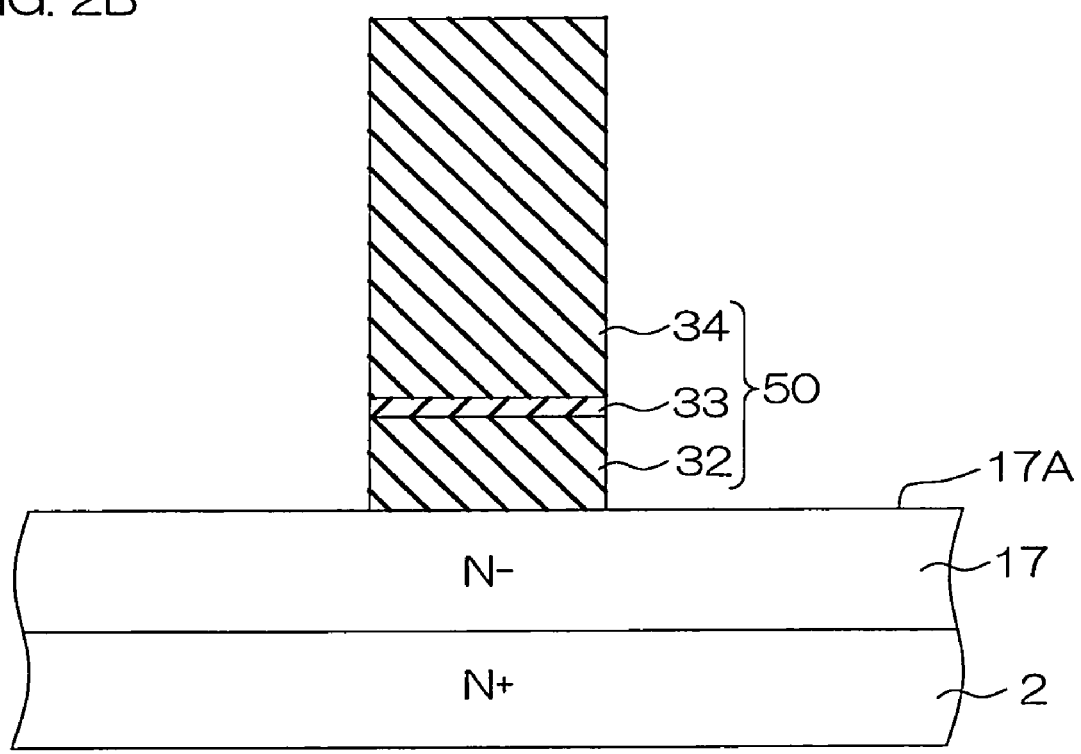

Then, an $SiO_2$ layer (having a thickness of 1 μm to 10 μm, for example), an SiN layer (having a thickness of 0.05 μm to 0.2 μm, for example) and another $SiO_2$ layer (having a thickness of 1 μm to 1.5 μm, for example) are successively formed on the N⁻-type layer 17, and these layers are patterned. Thus, an insulating layer 50 consisting of first, second and third insulating layers 32, 33 and 34 having a prescribed pattern (for partially exposing the upper surface 17A of the N⁻-type layer 17) is formed on the upper surface 17A of the N⁻-type layer 17 (one surface of a first semiconductor layer), as shown in FIG. 2B (step of forming an insulating layer).

Figure 2C:
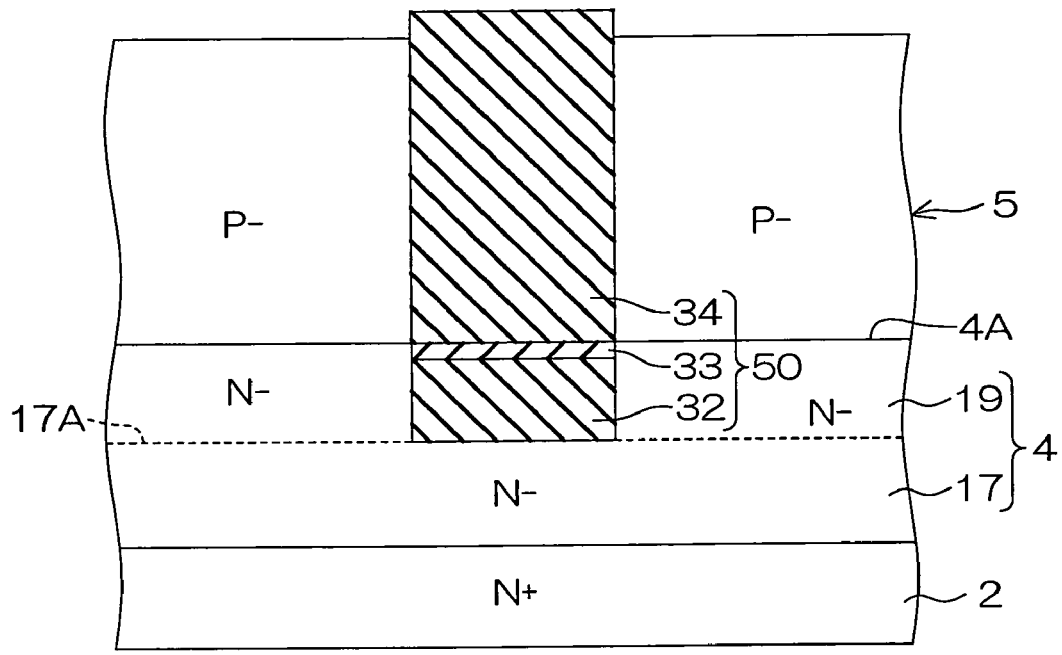

Then, an N⁻-type semiconductor layer is epitaxially grown on the upper surface 17A of the N⁻-type layer 17. This N⁻-type semiconductor layer is grown up to a height where the upper surface thereof is flush with the upper surface of the second insulating layer 33. Thus, an N⁻-type layer 19 is formed on the upper surface 17A of the N⁻-type layer 17 (step of growing a second semiconductor layer) to form the N⁻-type layer 4 constituted of the N⁻-type layers 17 and 19, as shown in FIG. 2C.

After the formation of the N⁻-type layer 4, a P⁻-type semiconductor layer is grown on the N⁻-type layer 4. This P⁻-type semiconductor layer is grown up to a height where the upper surface thereof is positioned slightly below the upper surface of the insulating layer 50 (upper surface of the third insulating layer 34), for example. Thus, the body layer 5 is formed on the N⁻-type layer 4, as shown in FIG. 2C (step of growing a body layer).

Figure 2D:
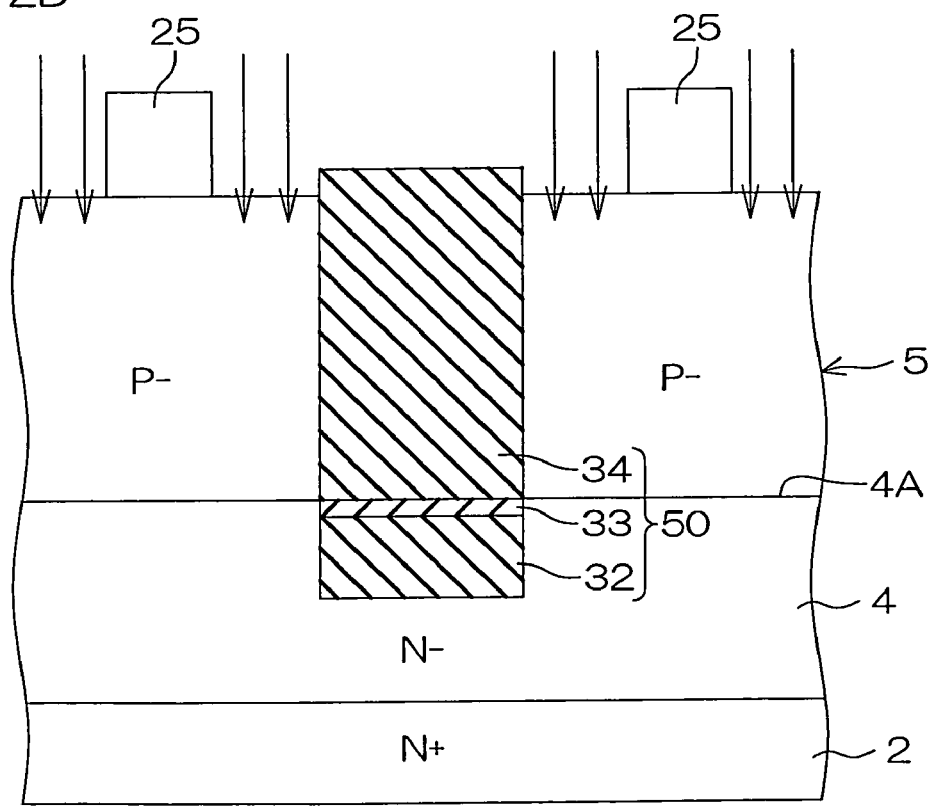

Thereafter a mask 25 having a opening on a portion opposed to the portion for forming the source region 9 is formed on the body layer 5, as shown in FIG. 2D. Then, ions of an N-type impurity (P (phosphorus), for example) are implanted into the surface layer portion of the body layer 5 through the opening of the mask 25. After this ion implantation, the mask 25 is removed.

Figure 2E:
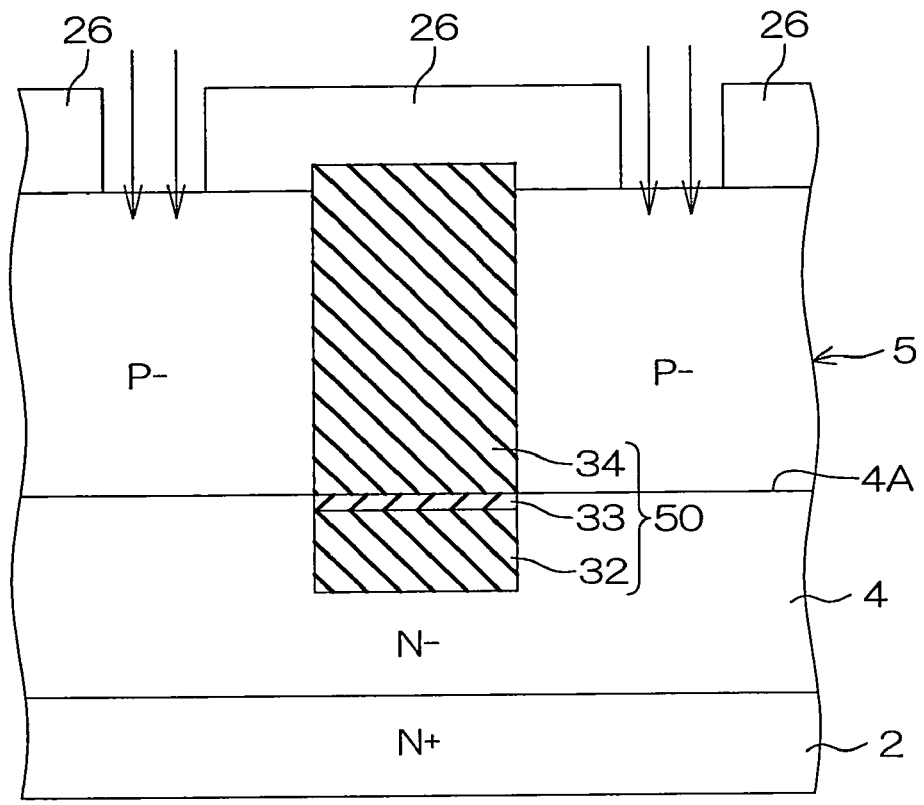

As shown in FIG. 2E, another mask 26 having an opening on a portion opposed to the portion for forming the source contact region 10 is formed on the body layer 5. Then, ions of a P-type impurity (B (boron), for example) are implanted into the surface layer portion of the body layer 5 through the opening of the mask 26. After this ion implantation, the mask 26 is removed.

Figure 2F:
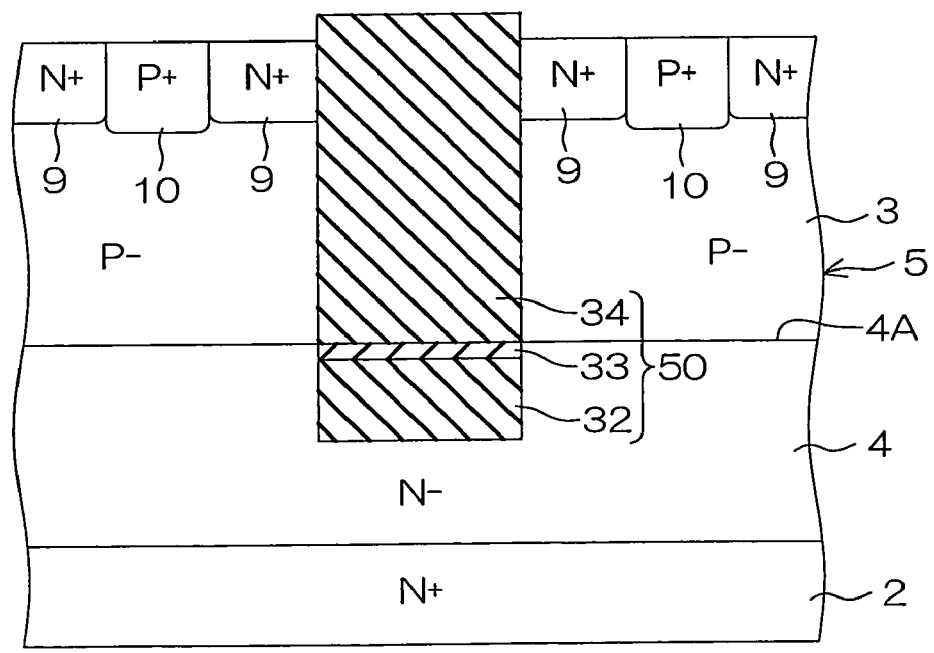

Thereafter annealing is performed. The ions of the N-type and P-type impurities implanted into the surface layer portion of the body layer 5 are activated due to this annealing, to form the source region 9 and the source contact region 10 on the surface layer portion of the body layer 5, as shown in FIG. 2F (step of forming a source region). The remaining portion of the body layer 5 other than the source region 9 and the source contact region 10 forms the body region 3 in the state after the epitaxial growth.

Figure 2G:
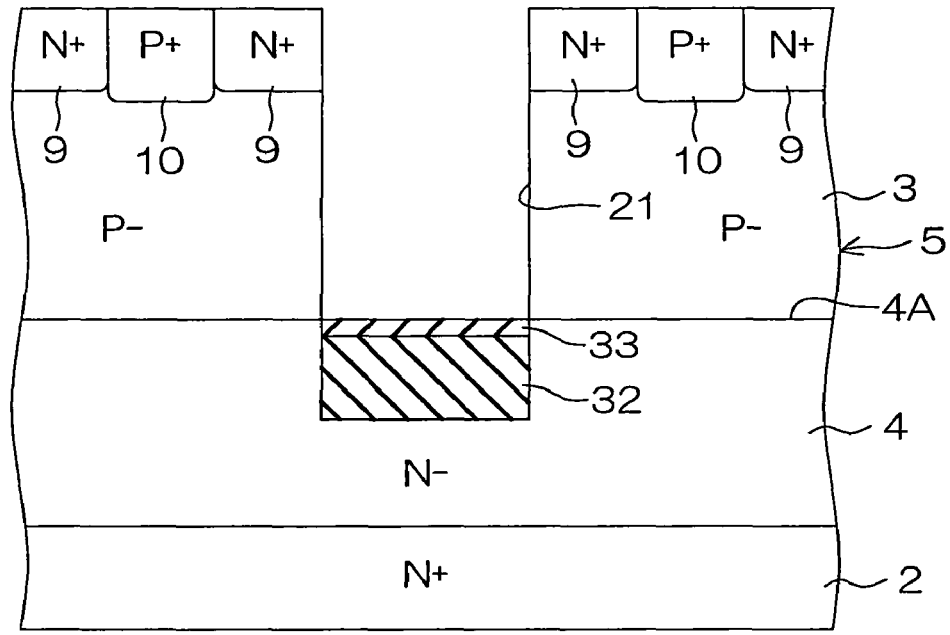

Then, the insulating layer 50 is removed by dry etching or wet etching with HF (hydrofluoric acid), until the upper surface thereof is flush with the upper surface 4A of the N⁻-type layer 4. In other words, the third insulating layer 34 is removed from the insulating layer 50 while a trench 21 having a bottom surface defined by the upper surface of the second insulating layer 33 is formed in the body layer 5 and the first and second insulating layers 32 and 33 of the insulating layer 50 are left as a part of the gate insulating film 7, as shown in FIG. 2G.

Figure 2H:
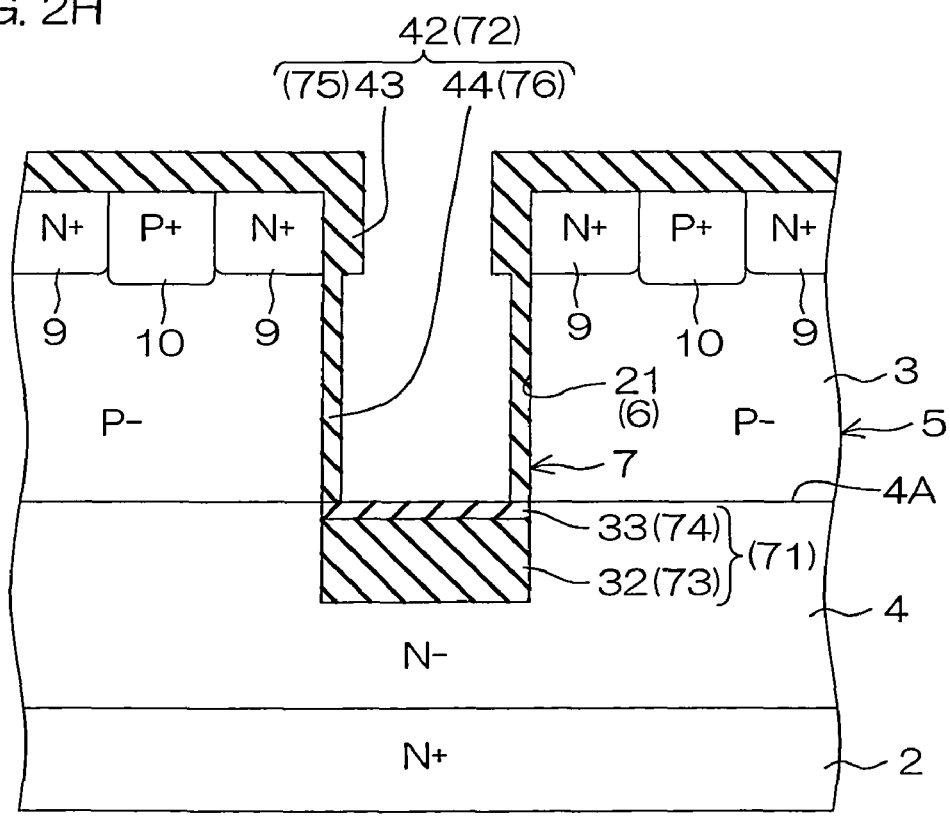

Then, the surface of the body layer 5 including the side surfaces of the trench 21 is oxidized by thermal oxidation, to form an oxide film 42, as shown in FIG. 2H (step of forming an oxide film).

The source region 9 of the body layer 5 has a higher impurity concentration than the body region 3, and is oxidized at a higher rate of oxidation than the body region 3. Therefore, a source region opposed portion 43 opposed to the source region 9 with a relatively large thickness and a body region opposed portion 44 opposed to the body region 3 with a relatively small thickness are formed in the oxide film 42. Thus, the gate insulating film 7 constituted of the bottom portion of the insulating layer 50 consisting of the first and second insulating layers 32 and 33 and the oxide film 42 is formed as shown in FIG. 2H. The first layer 32 and the second layer 33 form the lower layer film 73 and the upper layer film 74 of the gate insulating film 7, respectively. On the other hand, the source region opposed portion 43 and the body region opposed portion 44 of the oxide film 42 form the source region opposed portion 75 and the body region opposed portion 76 of the gate insulating film 7 respectively. Further, a portion surrounded by the side surfaces of the trench 21 and the contact interface between the N⁻-type layer 4 and the bottom portion 71 constitutes the gate trench 6.

Figure 2I:
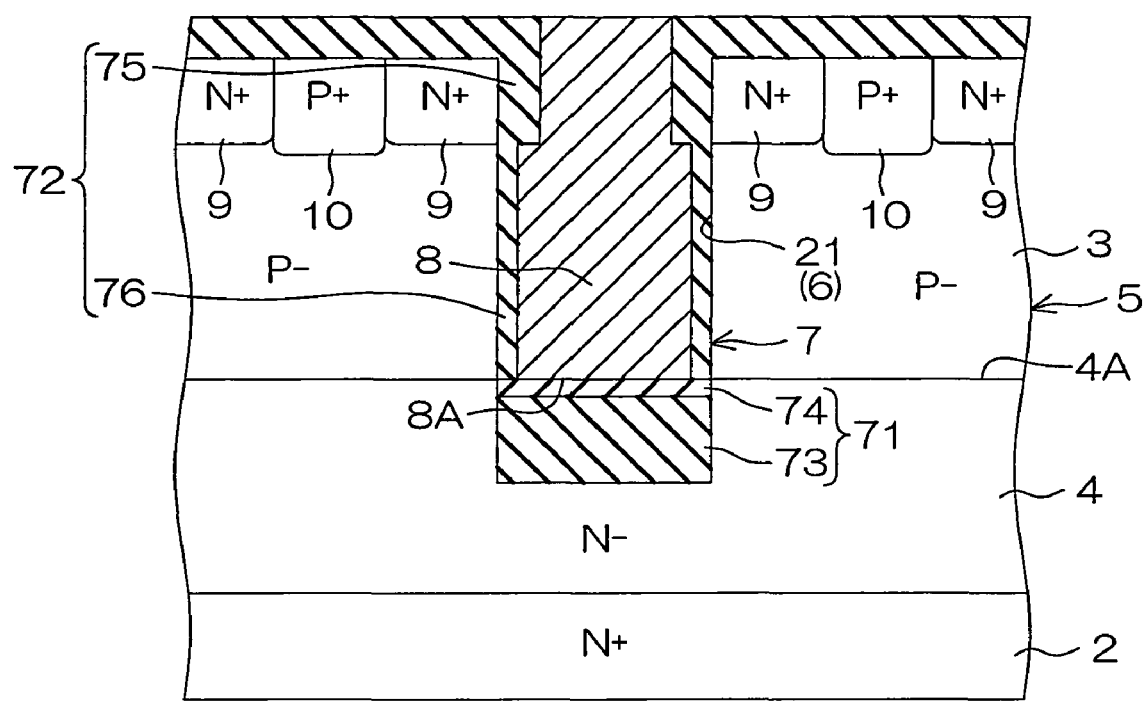

Then, a deposition layer of polysilicon doped with an N-type impurity (P (phosphorus), for example) in a high concentration is formed on the gate insulating film 7 by CVD. The gate trench 6 is filled up with the deposition layer of polysilicon. Then, a portion of the deposition layer of polysilicon located outside the gate trench 6 is removed by etching. Thus, the gate electrode 8 embedded in the gate trench 6 is obtained, as shown in FIG. 2I (step of forming a gate electrode).

Figure 2J:
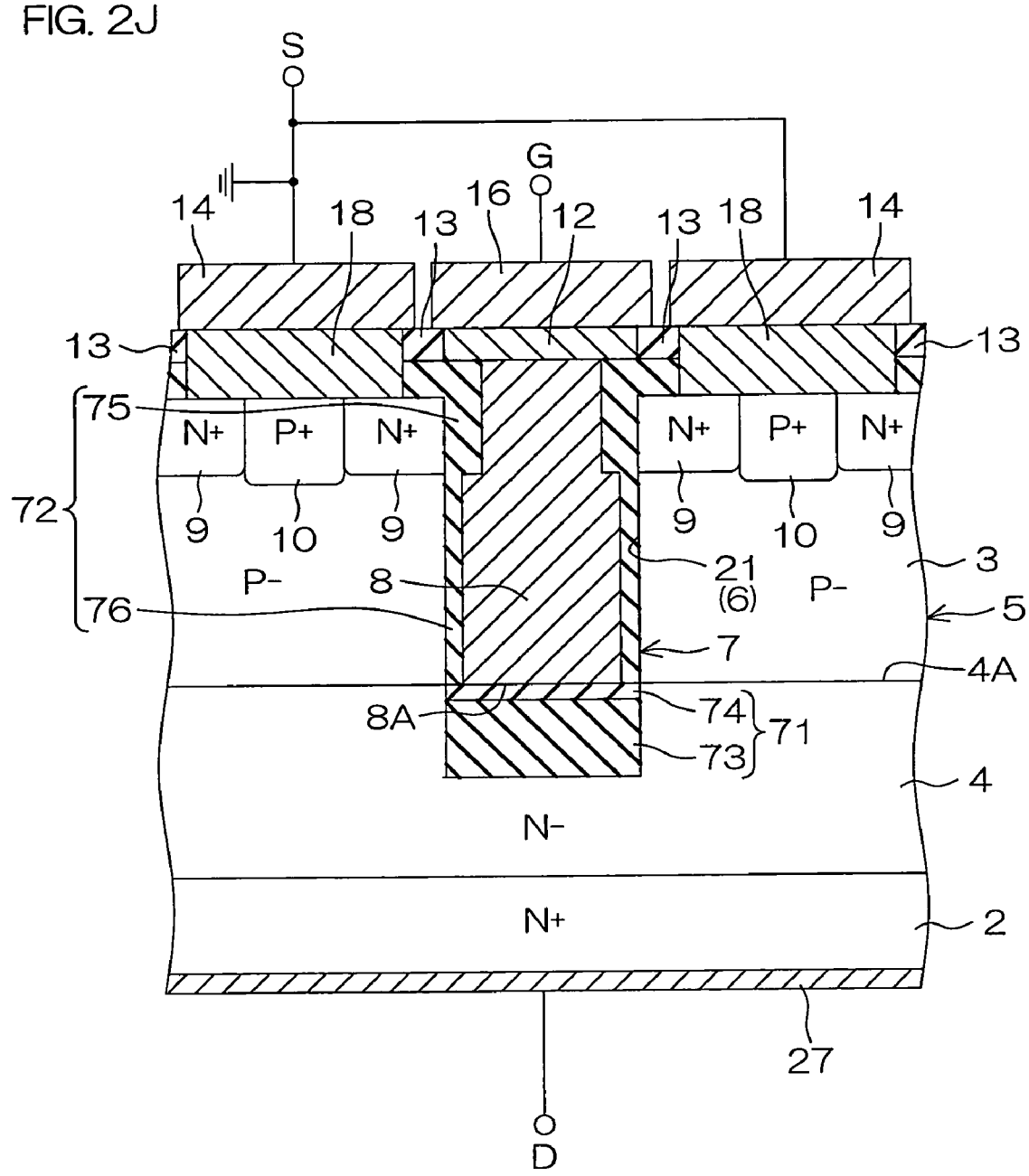

After the aforementioned steps, the interlayer dielectric film 13 is formed on the gate insulating film 7 by CVD, as shown in FIG. 2J. Thereafter the gate plug 12 is provided through the gate insulating film 7 and the interlayer dielectric film 13, and the gate wire 16 is formed on this gate plug 12. Further, the source plug 18 is provided through the gate insulating film 7 and the interlayer dielectric film 13, and the source wire 14 is formed on this source plug 18. In addition, the drain electrode 27 is formed on the back surface of the N⁺-type substrate 2. Thus, the semiconductor device 1 shown in FIG. 1 is obtained.

Figure 3:
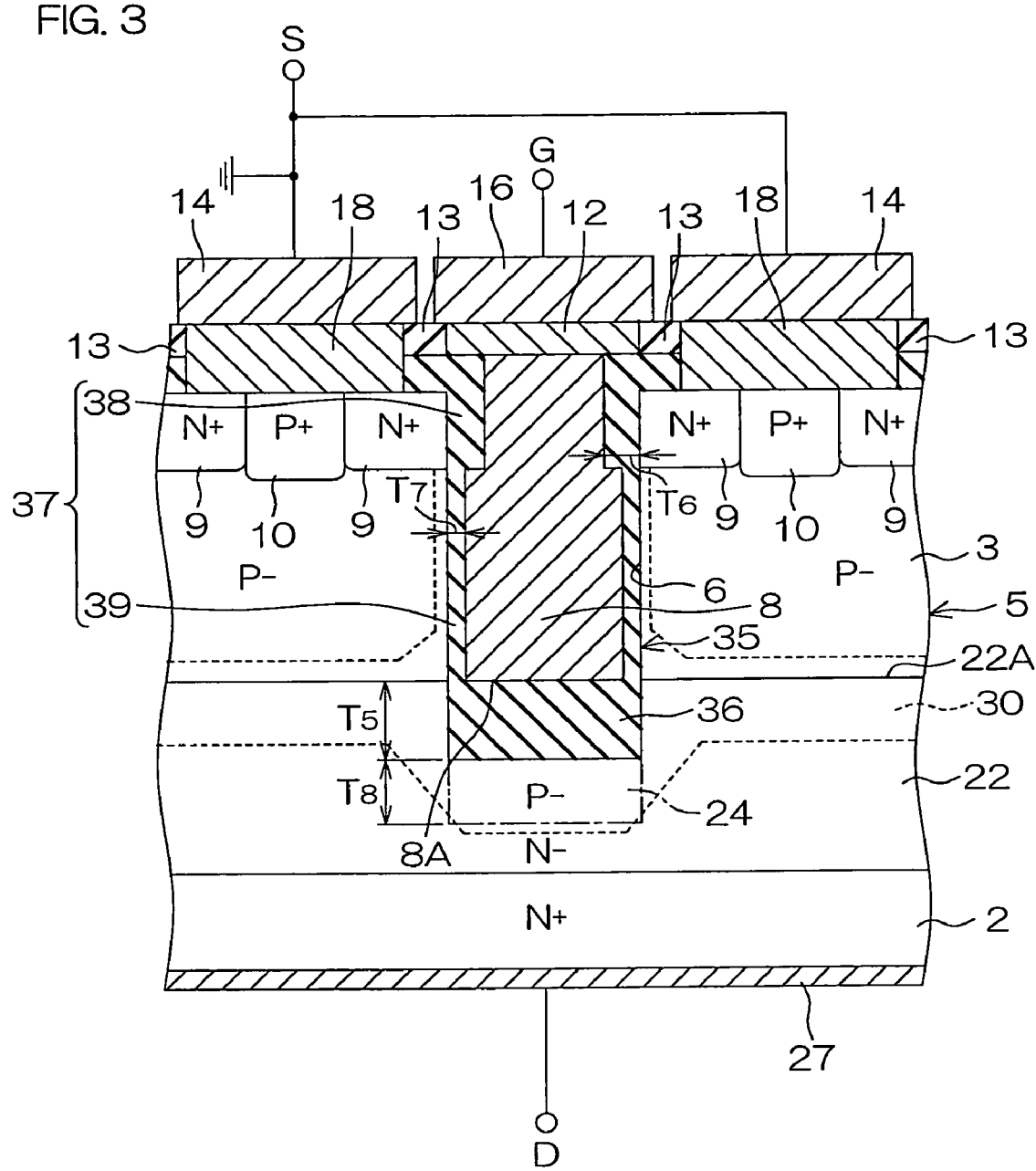
FIG. 3 is a schematic sectional view of a semiconductor device according to a second embodiment of the present invention.

FIG. 3 is a schematic sectional view of a semiconductor device 31 according to a second embodiment of the present invention. Referring to FIG. 3, portions corresponding to those shown in FIG. 1 are denoted by the same reference numerals. Further, redundant description is omitted as to the portions having the same reference numerals as the above.

In this semiconductor device 31, an N⁻-type layer 22 made of Si (silicon) doped with an N-type impurity in a lower concentration ($10^{15}$ cm⁻³, for example) than an N⁺-type substrate 2 is laminated on the N⁺-type substrate 2. A P⁻-type body layer 5 is laminated on the N⁻-type layer 22.

A gate trench 6 is dug in the semiconductor device 31 from the surface of the body layer 5. The gate trench 6 passes through the body layer 5, so that the deepest portion thereof reaches the N⁻-type layer 22. A gate insulating film 35 made of SiO₂ is formed on the inner surface of the gate trench 6 and the upper surface of the body layer 5, to cover the overall regions of the gate trench 6 and the body layer 5.

The gate insulating film 35 has a bottom portion 36 and an upper portion 37.

The bottom portion 36 is in contact with the N⁻-type layer 22 on the bottom surface and the side surfaces of the gate trench 6, so that the upper surface thereof is flush with the upper surface 22A of the N⁻-type layer 22 (interface between the N⁻-type layer 22 and the body layer 5). The bottom portion 36 has a thickness $T_5$ of 0.06 μm to 0.08 μm, for example.

The upper portion 37 has a source region opposed portion 38 opposed to a source region 9 and a body region opposed portion 39 opposed to a body region 3. The source region opposed portion 38 has a thickness $T_6$ of 0.06 μm to 0.1 μm, for example, and the body region opposed portion 39 has a thickness $T_7$ of 0.04 μm to 0.06 μm, for example.

A gate electrode 8 is embedded in the gate trench 6 by filling up the inner side of the gate insulating film 35 in the gate trench 6 with polysilicon doped with an N-type impurity (P (phosphorus), for example) in a high concentration. The bottom surface 8A of the gate electrode 8 is in contact with the upper surface of the bottom portion 36. In other words, the bottom surface 8A of the gate electrode 8 is flush with the upper surface 22A of the N⁻-type layer 22.

In the N⁻-type layer 22, a P⁻-type impurity-containing region 24 is formed on a portion reaching a bottom portion of the N⁻-type layer 22 (position separated from the upper surface of the N⁺-type substrate 2 upward by a prescribed distance) from the bottom surface of the gate trench 6. The P⁻-type impurity-containing region 24 is a region of the N⁻-type layer 22 containing a P-type impurity. The P⁻-type impurity-containing region 24 has a thickness $T_8$ of 1 μm to 10 μm, for example. The P-type impurity concentration of the P⁻-type impurity-containing region 24 is higher than that of the body region 3 on an upper portion (close to the interface between the P⁻-type impurity-containing region 24 and the bottom portion 36) thereof, and reduced toward a lower portion thereof.

Also in this semiconductor device 31, the bottom surface 8A of the gate electrode 8 and the upper surface 22A of the N⁻-type layer 22 are flush with each other, whereby the opposed areas of the gate electrode 8 and the N⁻-type layer 22 can be reduced. Therefore, a parasitic capacitance $C_{ox3}$ formed between the gate electrode 8 and the N⁻-type layer 22 can be reduced. Consequently, the gate capacitance $C_{g2}$ can be reduced, and the gate charge quantity $Q_{g2}$ can also be reduced.

Further, the bottom surface 8A of the gate electrode 8 and the upper surface 22A of the N⁻-type layer 22 are flush with each other, whereby the on-resistance $R_{on2}$ of the semiconductor device 31 remains unincreased. In other words, the gate charge quantity $Q_{g2}$ can be reduced without increasing the on-resistance $R_{on2}$ in the structure of the semiconductor device 31.

In the semiconductor device 31, further, the P⁻-type impurity-containing region 24 is formed on the portion reaching the bottom portion of the N⁻-type layer 22 (position separated from the upper surface of the N⁺-type substrate 2 upward by the prescribed distance) from the bottom surface of the gate trench 6. Therefore, the thickness (extension in the thickness direction of the N⁻-type layer 22) of a depletion layer 30 spreading below the gate trench 6 from the interface between the N⁻-type layer 22 and the body layer 5 (body region 3) can be increased. Thus, a capacitance $C_{dep2}$ of the depletion layer 30 can be reduced, and the withstand voltage of the semiconductor device 31 can be improved.

FIGS. 4A to 4K are sectional views successively showing the steps of manufacturing the semiconductor device 31.

Figure 4A:
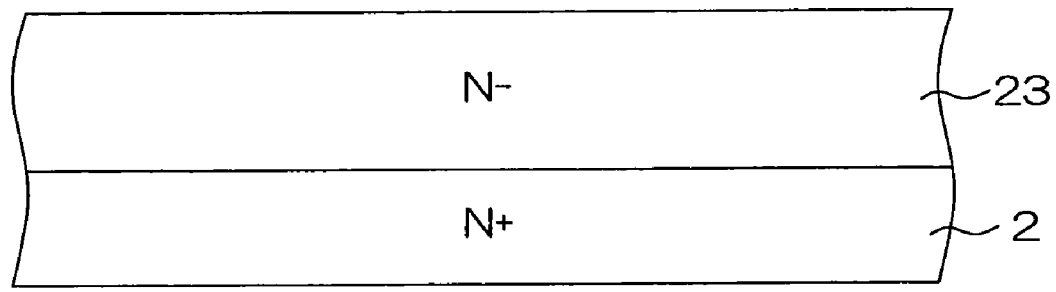
FIGS. 4A to 4K are sectional views successively showing the steps of manufacturing the semiconductor device shown in FIG. 3.

First, an N⁻-type layer 23 (First semiconductor layer) is formed on the N⁺-type substrate 2 by epitaxy, as shown in FIG. 4A.

Figure 4B:
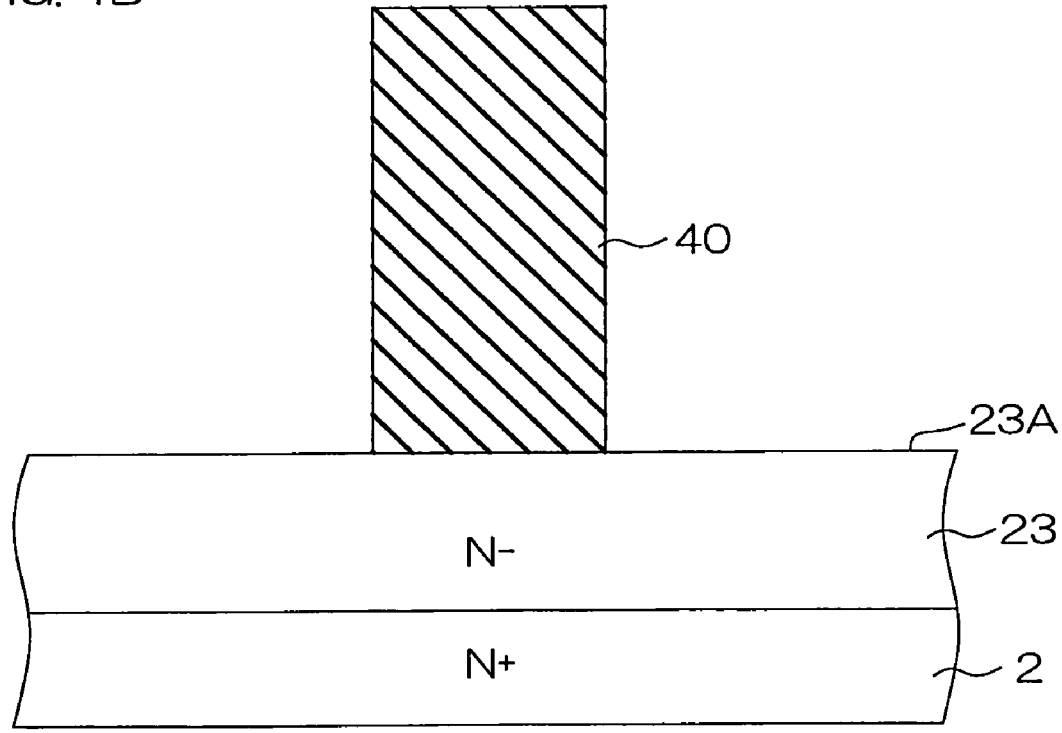

Then, an SiO₂ layer (having a thickness of 1 μm to 1.5 μm, for example) is formed on the N⁻-type layer 23, and patterned. Thus, an insulating layer 40 of a prescribed pattern (for partially exposing the upper surface 23A of the N⁻-type layer 23) is formed on the upper surface 23A of the N⁻-type layer 23 (one surface of a first semiconductor layer), as shown in FIG. 4B (step of forming an insulating layer).

Figure 4C:
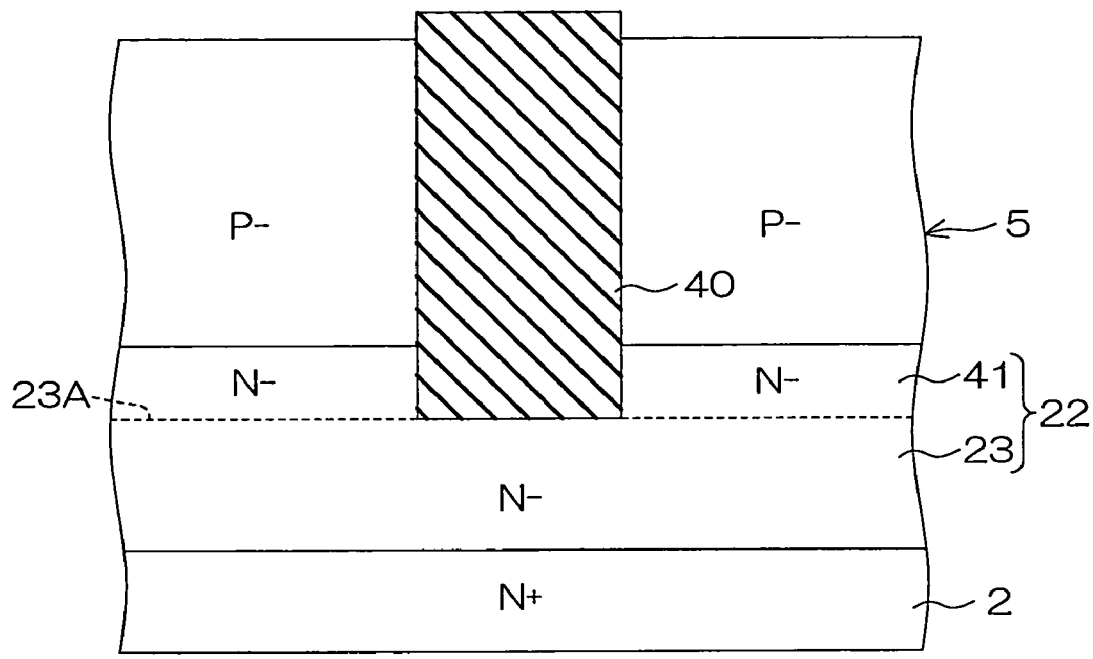

Then, an N⁻-type semiconductor layer is epitaxially grown on the upper surface 23A of the N⁻-type layer 23. This N⁻-type semiconductor layer is grown until the upper surface thereof is positioned at a height of 0.03 μm to 0.04 μm, for example, from the upper surface 23A of the N⁻-type layer 23. Thus, an N⁻-type layer 41 is formed on the upper surface 23A of the N⁻-type layer 23 (step of growing a second semiconductor layer), and the N⁻-type layer 22 constituted of the N⁻-type layers 23 and 41 is formed, as shown in FIG. 4C.

After the formation of the N⁻-type layer 22, a P⁻-type semiconductor layer is grown on the N⁻-type layer 22. This P⁻-type semiconductor layer is grown up to a height where the upper surface thereof is positioned slightly below the upper surface of the insulating layer 40. Thus, the body layer 5 is formed on the N⁻-type layer 22, as shown in FIG. 4C (step of growing a body layer).

Figure 4D:
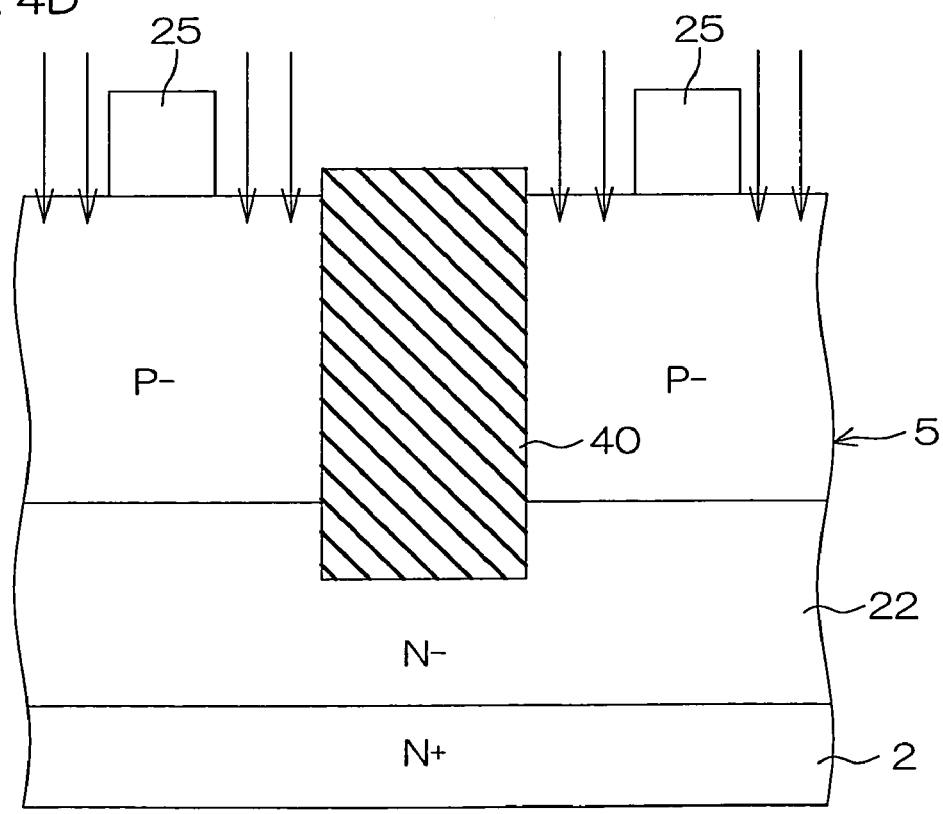

Thereafter a mask 25 having an opening on a portion opposed to the portion for forming the source region 9 is formed on the body layer 5, as shown in FIG. 4D. Then, ions of an N-type impurity (P (phosphorus), for example) are implanted into the surface layer portion of the body layer 5 through the opening of the mask 25. After this ion implantation, the mask 25 is removed.

Figure 4E:
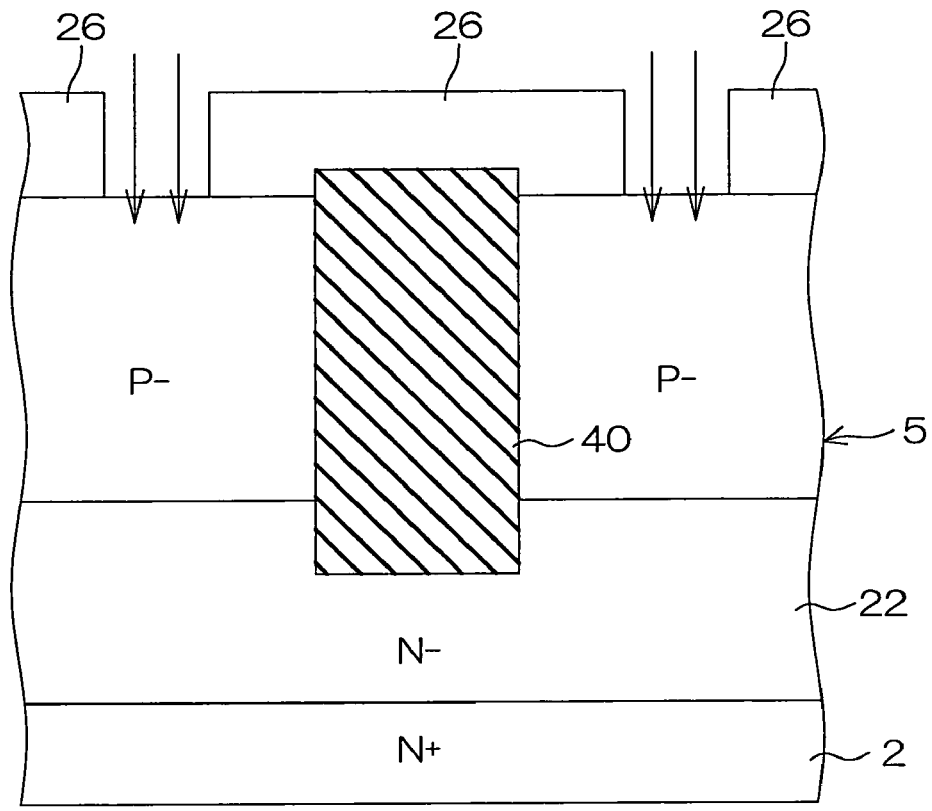

As shown in FIG. 4E, another mask 26 having an opening on a portion opposed to a portion for forming a source contact region 10 is formed on the body layer 5. Then, ions of a P-type impurity (B (boron), for example) are implanted into the surface layer portion of the body layer 5 through the opening of the mask 26. After this ion implantation, the mask 26 is removed.

Figure 4F:
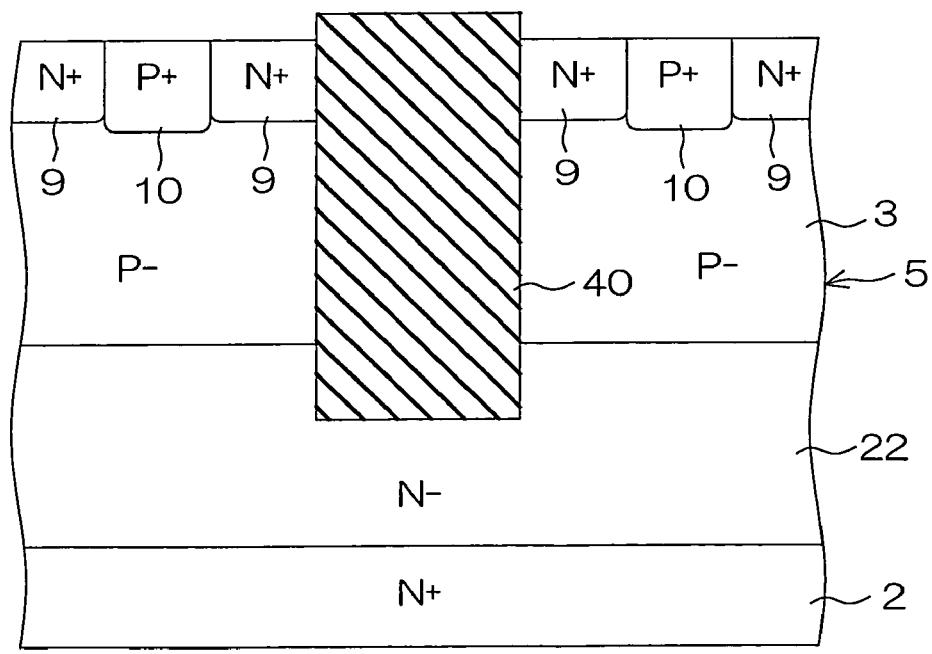

Thereafter annealing is performed. The ions of the N-type and P-type impurities implanted into the surface layer portion of the body layer 5 are activated due to this annealing, to form the source region 9 and the source contact region 10 on the surface layer portion of the body layer 5, as shown in FIG. 4F (step of forming a source region). The remaining portion of the body layer 5 other than the source region 9 and the source contact region 10 forms the body region 3 in the state after the epitaxial growth.

Figure 4G:
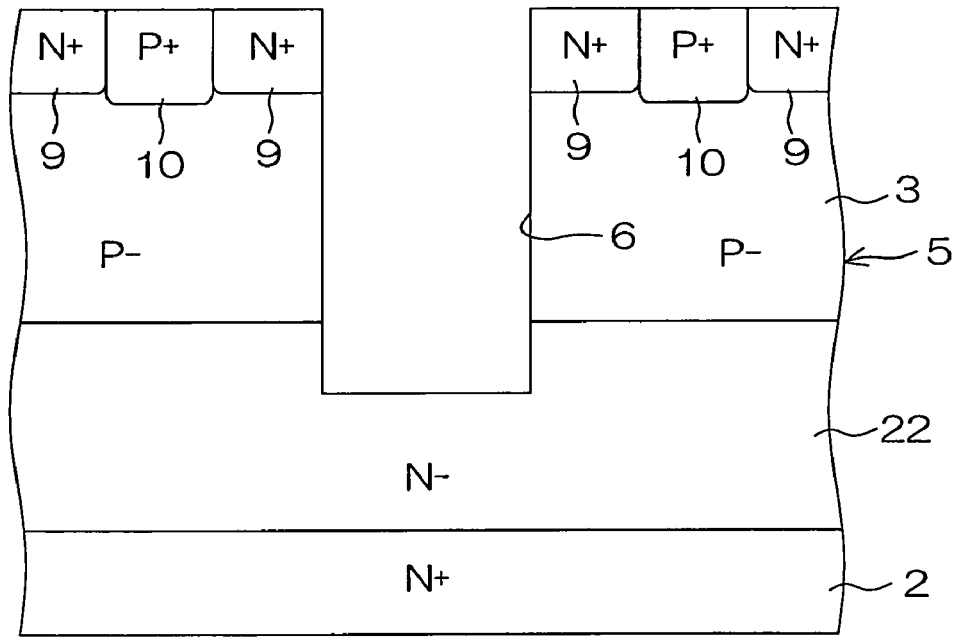

Then, the insulating layer 40 is removed by dry etching or wet etching with HF. Thus, the gate trench 6 passing through the body layer 5 so that the deepest portion thereof reaches the N⁻-type layer 22 is formed as shown in FIG. 4G.

Figure 4H:
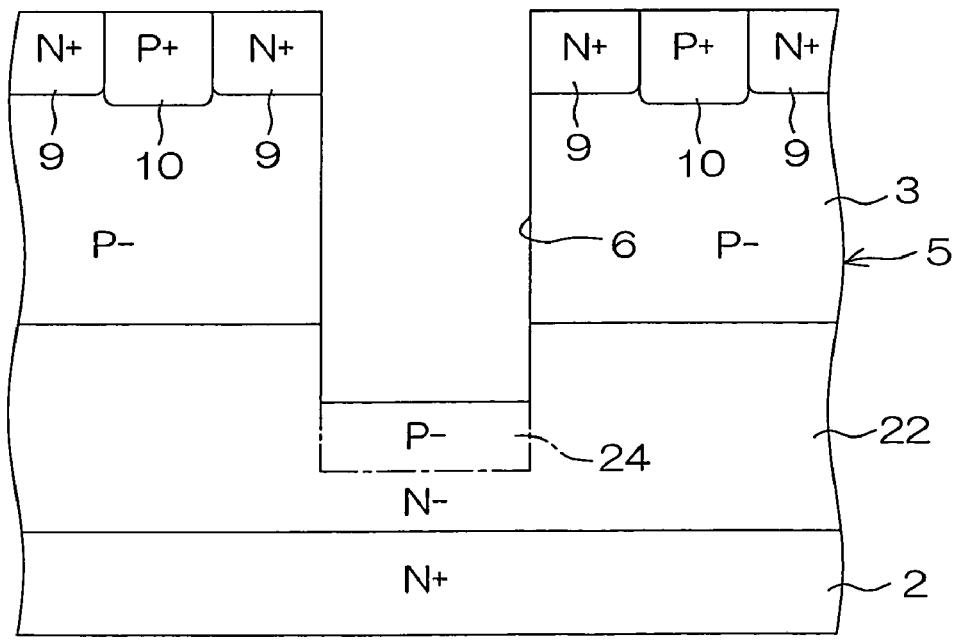

Then, ions of a P-type impurity (B (boron), for example) are implanted into the N⁻-type layer 22 from the bottom surface of the gate trench 6 (step of introducing a second conductivity type impurity). The P-type impurity ions are implanted in two stages. First, the P-type impurity ions are implanted at a high acceleration and a low injection rate (not less than several 100 keV and $10^{12}$ ion/cm$^2$ to $10^{13}$ ion/cm$^2$, for example), to spread over the region for forming the P$^-$-type impurity-containing region 24. Then, the P-type impurity ions are implanted at a low acceleration and a high injection rate (several keV to 10-odd keV and $10^{13}$ ion/cm$^2$, for example), to be introduced mainly into a portion around the bottom surface of the gate trench 6. Thus, the P$^-$-type impurity-containing region 24 is formed on the portion reaching the bottom portion of the N$^-$-type layer 22 (position separated from the upper surface of the N$^+$-type substrate 2 upward by the prescribed distance) from the bottom surface of the gate trench 6, as shown in FIG. 4H.

Figure 4I:
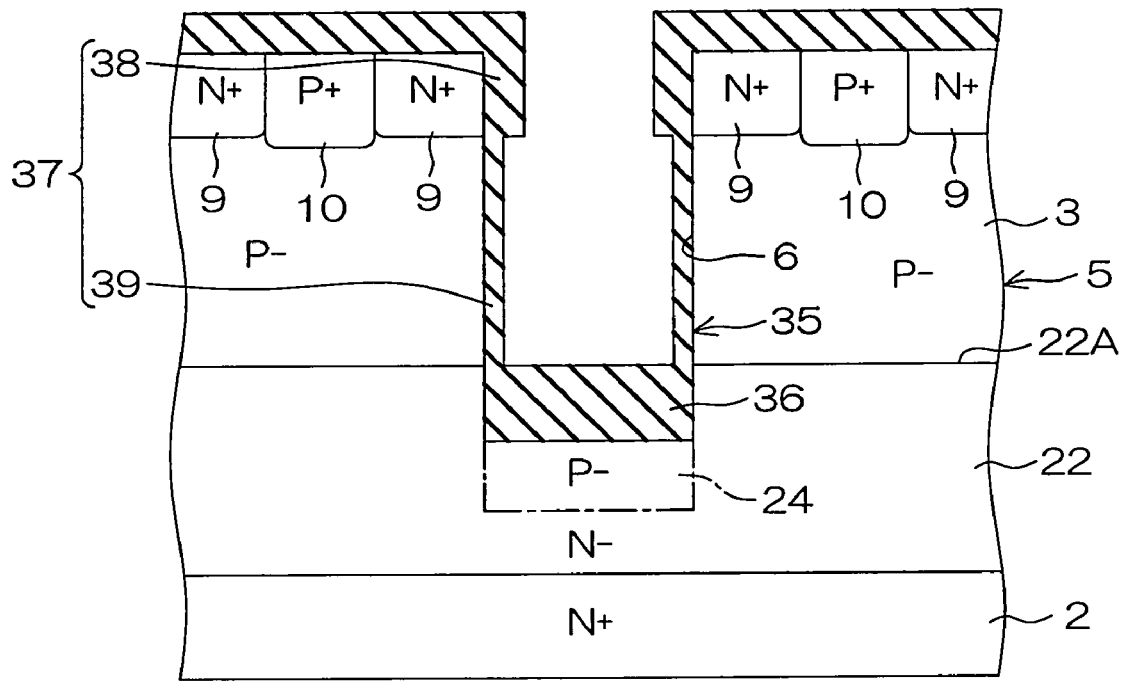

Then, the bottom surface and the side surfaces of the gate trench 6 and the upper surface of the body layer 5 are oxidized by thermal oxidation, to form the gate insulating film 35, as shown in FIG. 4I (step of forming a gate insulating film). The source region 9 of the body layer 5 has a higher impurity concentration than the body region 3, and is oxidized at a higher rate of oxidation than the body region 3. Further, the P$^-$-type impurity-containing region 24 around the bottom surface of the gate trench 6 has a higher P-type impurity concentration than the body region 3, and is also oxidized at a higher rate of oxidation than the body region 3. The gate insulating film 35 is provided with the bottom portion 36, the source region opposed portion 38 and the body region opposed portion 39. The bottom portion 36 is so formed that the upper surface thereof is flush with the upper surface 22A of the N$^-$-type layer 22, as shown in FIG. 4I.

Figure 4J:
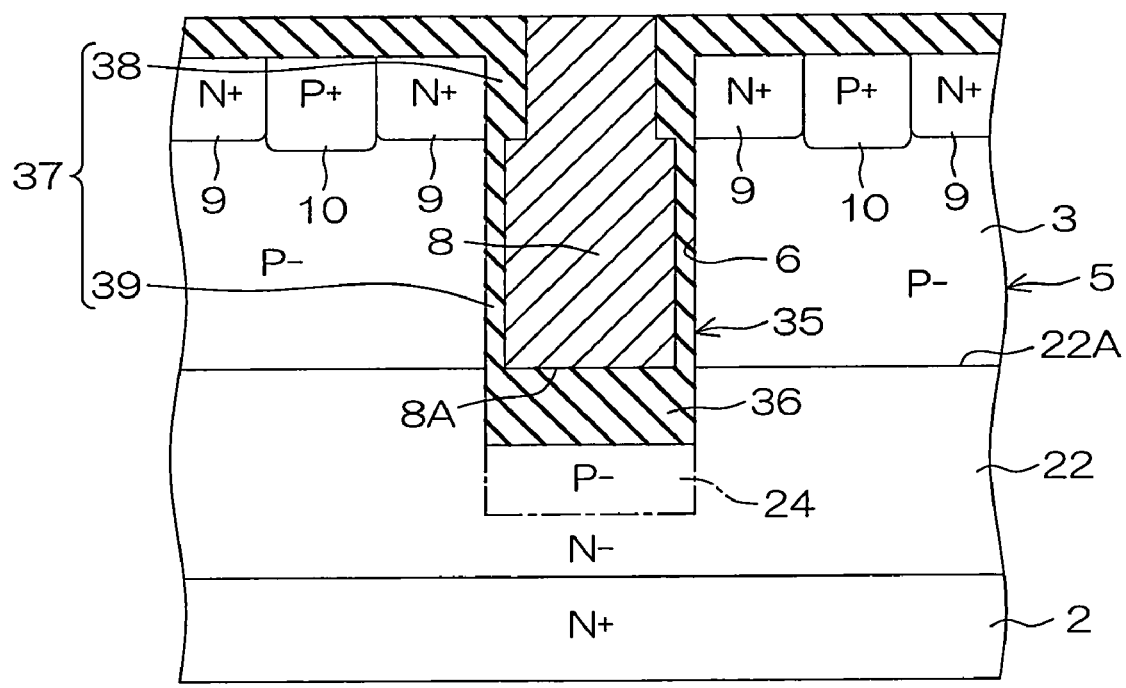

Then, a deposition layer of polysilicon doped with an N-type impurity (P (phosphorus), for example) in a high concentration is formed on the gate insulating film 35 by CVD. The gate trench 6 is filled up with the deposition layer of polysilicon. Then, a portion of the deposition layer of polysilicon located outside the gate trench 6 is removed by etching. Thus, the gate electrode 8 embedded in the gate trench 6 is obtained, as shown in FIG. 4J (step of forming a gate electrode).

Figure 4K:
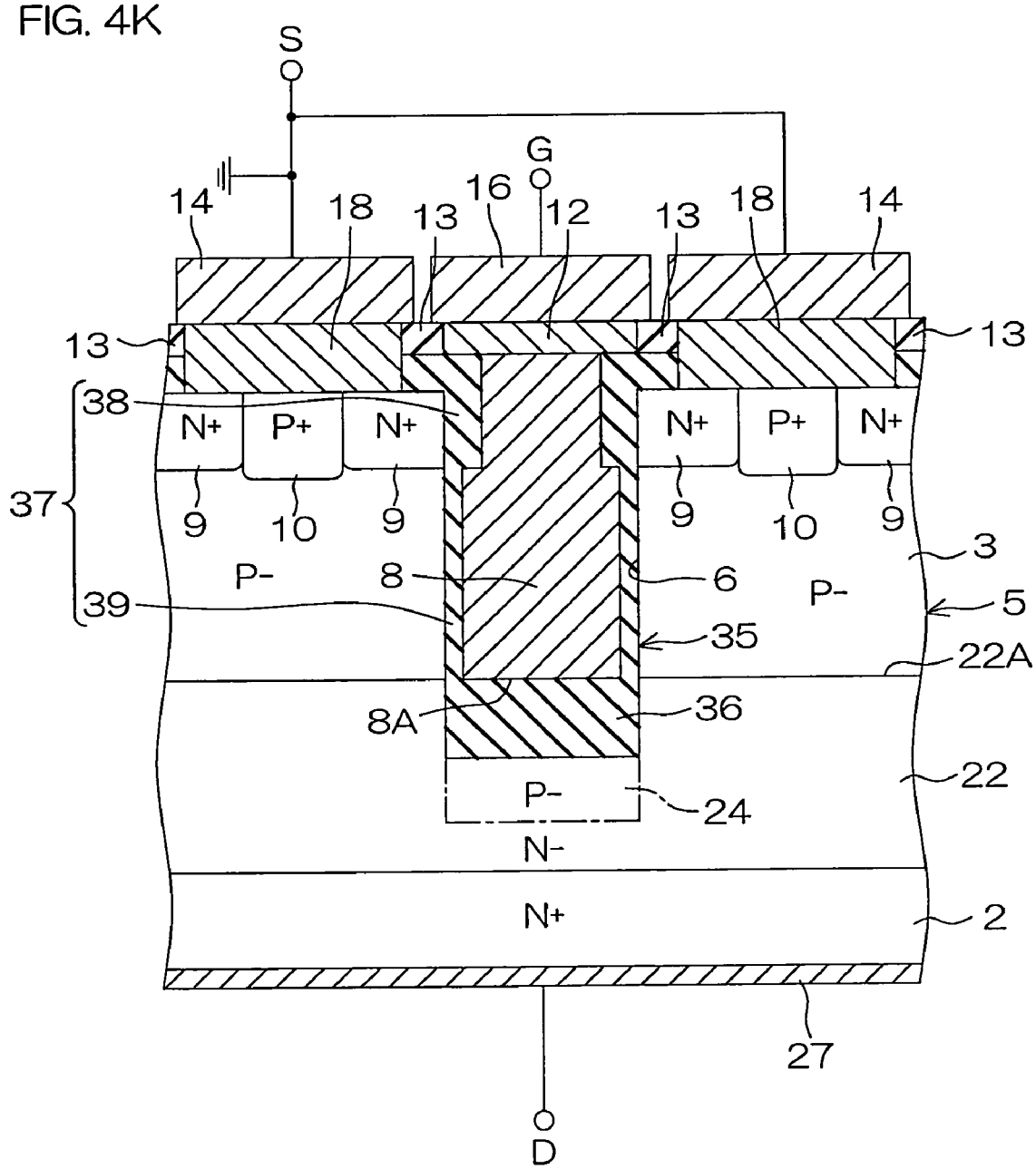

After the aforementioned steps, an interlayer dielectric film 13 is formed on the gate insulating film 35 by CVD, as shown in FIG. 4K. Thereafter a gate plug 12 is provided through the gate insulating film 35 and the interlayer dielectric film 13, and a gate wire 16 is formed on this gate plug 12. Further, a source plug 18 is provided through the gate insulating film 35 and the interlayer dielectric film 13, and a source wire 14 is formed on this source plug 18. In addition, a drain electrode 27 is formed on the back surface of the N$^+$-type substrate 2. Thus, the semiconductor device 31 shown in FIG. 3 is obtained.

FIG. 5 is a schematic sectional view of a semiconductor device 51 according to a third embodiment of the present invention.

The semiconductor device 51 has an array structure formed by arranging unit cells having trench gate VDMOSFETS in the form of a matrix.

On an N$^+$-type substrate 52 forming the base of the semiconductor device 51, an N$^-$-type epitaxial layer 53 made of Si (silicon) doped with an N-type impurity in a lower concentration ($1\times10^{15}$ cm$^{-3}$ to $4\times10^{15}$ cm$^{-3}$, for example) than the N$^+$-type substrate 52 is laminated. The base layer portion of the epitaxial layer 53 forms an N$^-$-type region 54 as a first conductivity type region in the state after the epitaxial growth.

In the epitaxial layer 53, a P$^-$-type body region 55 is formed on the N$^-$-type region 54, in contact with the N$^-$-type region 54.

A gate trench 56 is dug in the epitaxial layer 53 from the surface thereof. The gate trench 56 passes through the body region 55, so that the deepest portion thereof reaches the N$^-$-type region 54. A plurality of such gate trenches 56 are formed at regular intervals in the horizontal direction in FIG. 5, to extend in a direction (along the gate widths) perpendicular to the plane of FIG. 5 respectively. Each gate trench 56 has a width $W_1$ of 0.5 μm, for example, in the horizontal direction (along the gate width) in FIG. 5.

A gate insulating film 57 made of SiO$_2$ (silicon oxide) is formed in the gate trench 56, to cover the overall inner surface thereof. A gate electrode 58 is embedded in the gate trench 56 by filling up the inner side of the gate insulating film 57 with polysilicon doped with an N-type impurity in a high concentration.

In the N$^-$-type region 54 of the epitaxial layer 53, an intrinsic semiconductor region 67 (low-concentration region) is formed on a portion reaching a bottom portion of the N$^-$-type region 54 (position separated from the upper surface of the N$^+$-type substrate 52 upward by a prescribed distance) from the bottom surface of the gate trench 56. The intrinsic semiconductor region 67 is a region made of an intrinsic semiconductor containing no impurity. In other words, the intrinsic semiconductor region 67 has a lower N-type impurity concentration than the remaining portion of the N$^-$-type region 54. The intrinsic semiconductor region 67 has a width $W_2$ equal to the width $W_1$ of the gate trench 56 and a thickness $T_{a1}$ of 1 μm to 5 μm, for example.

On the surface layer portion of the epitaxial layer 53, an N$^+$-type source region 59 having a higher N-type impurity concentration ($10^{19}$ cm$^{-3}$, for example) than the N$^-$-type region 54 is formed on each side of the gate trench 56 in the direction (horizontal direction in FIG. 5) orthogonal to the gate width. The source region 59 extends along the gate trench 56 in the direction along the gate width, so that the bottom portion thereof reaches the body region 55. A P$^+$-type source contact region 60 is formed at the center of the source region 59 in the direction orthogonal to the gate width, to pass through the source region 59.

In other words, gate trenches 56 and source regions 59 are alternately provided in the direction orthogonal to the gate widths, to extend in the direction along the gate widths respectively. The boundaries between the unit cells adjacent to one another in the direction orthogonal to the gate widths are set on the source regions 59, along the source regions 59. At least one or more source contact regions 60 are provided over each pair of unit cells adjacent to each other in the direction orthogonal to the gate width. The boundaries between the unit cells adjacent to one another in the direction along the gate widths are so set that the gate electrode 58 included in each unit cell has a constant gate width.

An interlayer dielectric film 63 is laminated on the epitaxial layer 53. A source wire 64 is formed on the interlayer dielectric film 63. This source wire 64 is grounded. Further, the source wire 64 is in contact (electrically connected) with the source region 59 and the source contact region 60 through a source plug 68 embedded in a contact hole 65 formed in the interlayer dielectric film 63. A gate wire 66 is formed on the interlayer dielectric film 63. The gate wire 66 is in contact (electrically connected) with the gate electrode 58 through a gate plug 62 embedded in another contact hole 61 formed in the interlayer dielectric film 63.

A drain electrode 87 is formed on the back surface of the N$^+$-type substrate 52.

A current can be fed between the source region 59 and the drain electrode 87 by controlling the potential of the gate electrode 58 while applying a positive voltage of a proper level to the drain electrode 87 thereby forming a channel in a portion (channel forming region 92) of the body region 55 close to the interface between the same and the gate insulating film 57.

In this semiconductor device 51, the intrinsic semiconductor region 67 is formed in the epitaxial layer 53 on the portion reaching the bottom portion of the N⁻-type region 54 from the bottom surface of the gate trench 56. Therefore, the thickness of a depletion layer 88, spreading from the interface between the N⁻-type region 54 and the body region 55, from the bottom surface of the gate trench 56 can be more increased as compared with the conventional structure as in the semiconductor device 100 shown in FIG. 9 provided with the N⁻-type region 103 having a uniform N-type impurity concentration, for example. Therefore, a gate-to-drain voltage applied to the gate insulating film 57 upon voltage application to the drain electrode 87 can be reduced. Consequently, the thickness of the gate insulating film 57 can be reduced, whereby channel resistance $R_{ch4}$ in the channel forming region 92 can be reduced, and the on-resistance $R_{on4}$ of the semiconductor device 51 can be reduced.

For example, the on-resistance $R_{on3}$ of the semiconductor device 100 shown in FIG. 9 and the on-resistance $R_{on4}$ of the semiconductor device 51 are compared with each other. Symbols used in this comparison are defined as follows:

Voltage $V_d$: drain voltage applied to the drain electrodes 114 and 87

Voltage $V_{ox1}$: voltage applied to the gate insulating film 57 due to application of the voltage $V_d$ Voltage $V_{ox2}$: voltage applied to the gate insulating film 106 due to application of the voltage $V_d$ Width $T_{dep1}$: thickness of the depletion layer 88 spreading in the semiconductor device 51 due to the application of the voltage $V_d$ Width $T_{dep2}$: thickness of the depletion layer 115 spreading in the semiconductor device 100 due to the application of the voltage $V_d$ Capacitance $C_{ox1}$: parasitic capacitance formed between the gate electrode 58 and the bottom surface of the gate trench 56 opposed to each other through the gate insulating film 57

Capacitance $C_{ox2}$: parasitic capacitance formed between the gate electrode 107 and the bottom surface of the gate trench 105 opposed to each other through the gate insulating film 106

Capacitance $C_{dep1}$: parasitic capacitance of the depletion layer 88

Capacitance $C_{dep2}$: parasitic capacitance of the depletion layer 115

In the semiconductor device 100, the voltage $V_{ox2}$ is expressed as follows:

$$V_{ox2} = C_{dep2} \cdot V_d / (C_{dep2} + C_{ox2})$$

In the semiconductor device 51, on the other hand, the voltage $V_{ox1}$ is expressed as follows:

$$V_{ox1} = C_{dep1} \cdot V_d / (C_{dep1} + C_{ox1})$$

Assuming that $C_{ox2} = C_{dep2} = C_{ox1}$, and $T_{dep1} = 4T_{dep2}$ and $C_{dep1} = C_{dep2}/4$ due to the formation of the intrinsic semiconductor region 67, the voltage $V_{ox2}$ in the semiconductor device 100 is equal to $V_d/2$.

On the other hand, the voltage $V_{ox1}$ in the semiconductor device 51 is equal to $V_d/5$. Thus, it is understood that the voltage $V_{ox1}$ applied to the gate insulating film 57 is smaller than the voltage $V_{ox2}$ applied to the gate insulating film 106.

In other words, the gate-to-drain voltage applied to the gate insulating film 57 upon voltage application to the drain electrode 87 can be reduced due to the formation of the intrinsic semiconductor region 67. Consequently, the thickness of the gate insulating film 57 can be reduced, whereby the channel resistance $R_{ch4}$ in the channel forming region 92 can be reduced, and the on-resistance $R_{on4}$ can be reduced.

FIGS. 6A to 6M are sectional views successively showing the steps of manufacturing the semiconductor device 51.

Figure 6A:
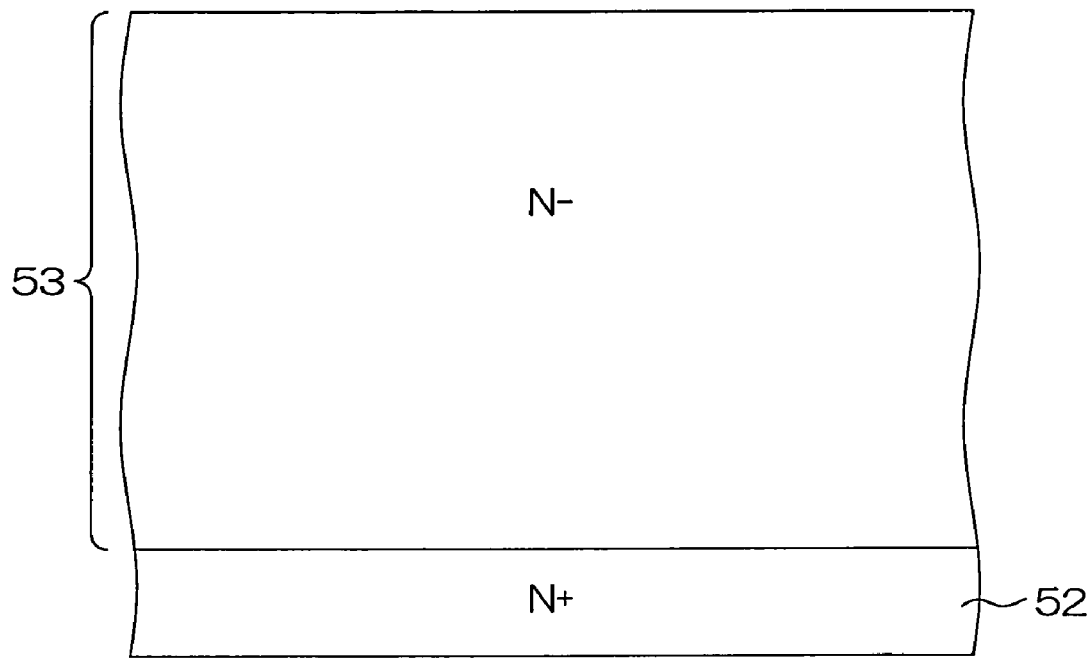
FIGS. 6A to 6M are sectional views successively showing the steps of manufacturing the semiconductor device shown in FIG. 5.
Figure 6B:
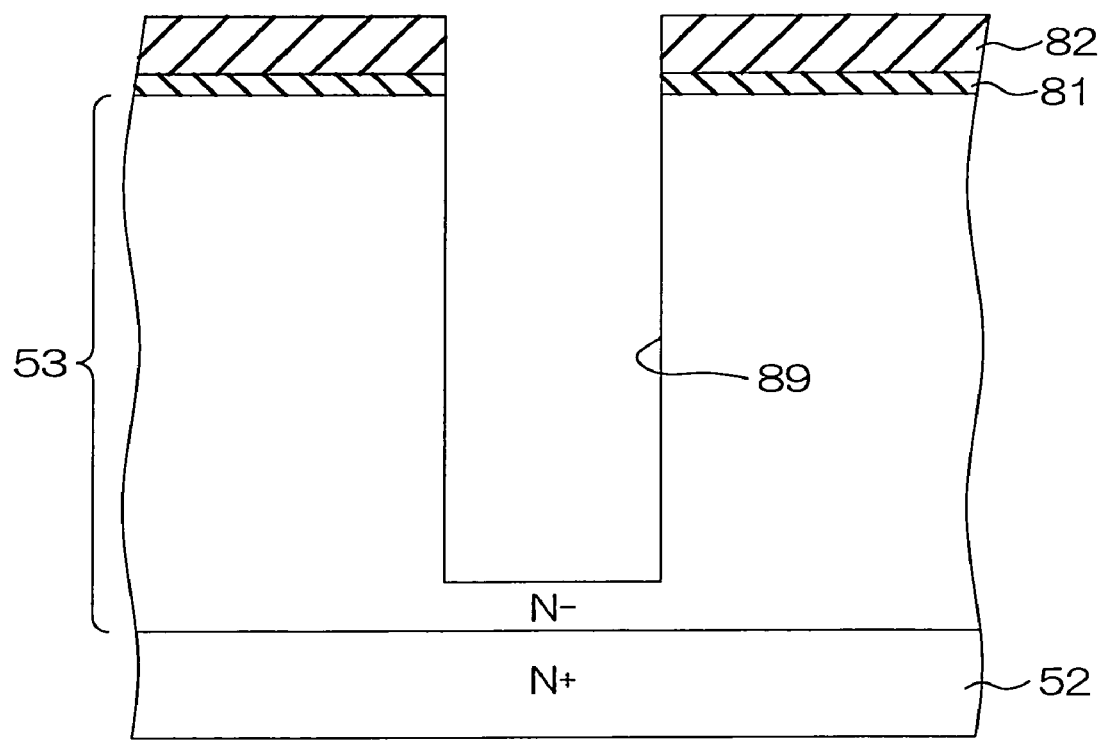

First, the epitaxial layer 53 is formed on the N⁺-type substrate 52 by epitaxy, as shown in FIG. 6A. Then, a sacrificial oxide film 81 made of $SiO_2$ is formed on the surface of the epitaxial layer 53 by thermal oxidation, as shown in FIG. 6B. Thereafter an SiN (silicon nitride) layer is formed on the sacrificial oxide layer 81 by P-CVD (Plasma Chemical Vapor Deposition) or LP-CVD (Low Pressure Chemical Vapor Deposition) and patterned, thereby forming a hard mask 82 having an opening in a portion opposed to a portion for forming a trench 89. Then, the trench 89 is formed by etching the sacrificial oxide film 81 and the epitaxial layer 53 through the hard mask 82 (step of forming a trench).

Figure 6C:
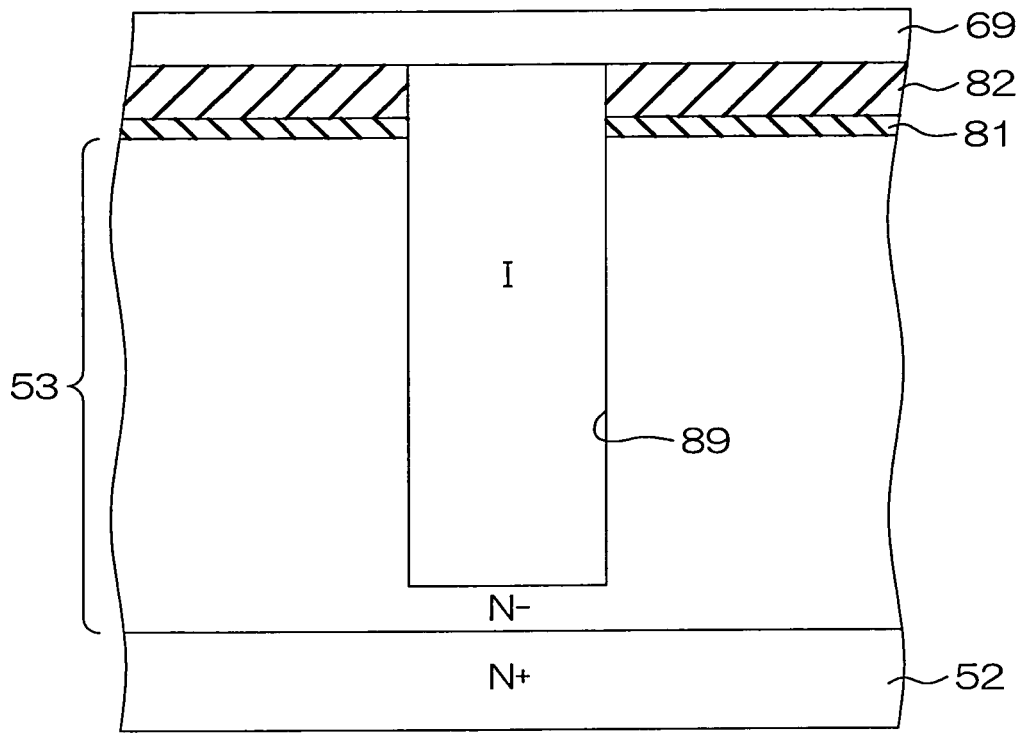

Then, Si containing no impurity is deposited on the epitaxial layer 53 by CVD, as shown in FIG. 6C. Si is so deposited as to fill up the trench 89 and to completely cover the epitaxial layer 53. Thus, a low-concentration material deposition layer 69 containing no impurity (having a lower N-type impurity concentration than the epitaxial layer 53) is formed in the trench 89 and on the epitaxial layer 53.

Figure 6D:
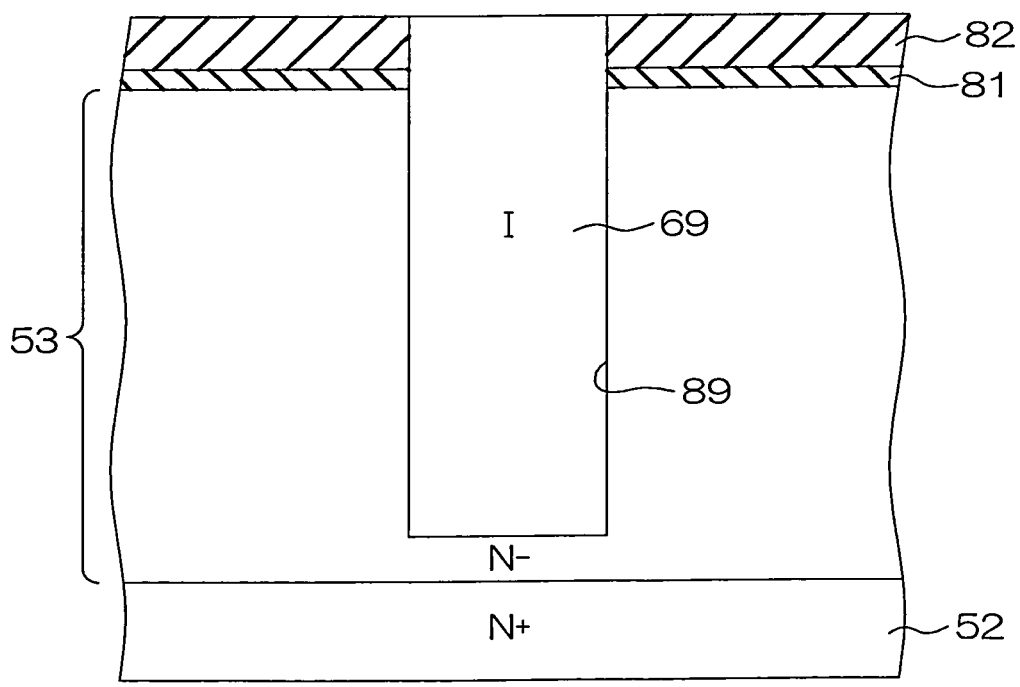

After the formation of the low-concentration material deposition layer 69, a portion of the low-concentration material deposition layer 69 located outside the trench 89 is removed by CMP (Chemical Mechanical Polishing), as shown in FIG. 6D. Then, the low-concentration material deposition layer 69 embedded in the trench 89 is partially removed through the sacrificial oxide film 81 and the hard mask 82 by dry etching.

Figure 6E:
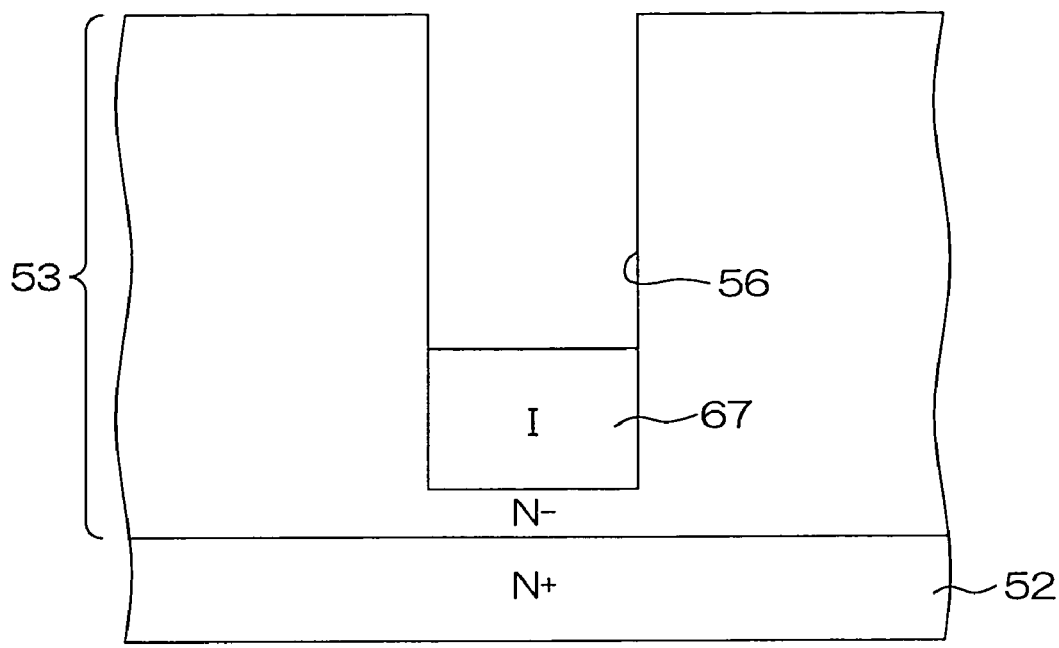

Thus, the intrinsic semiconductor region 67 partially forming the epitaxial layer 53 is formed on the bottom portion of the trench 89, as shown in FIG. 6E (step of embedding a semiconductor material). Due to this formation of the intrinsic semiconductor region 67, a portion of the trench 89 located above the intrinsic semiconductor region 67 defines the gate trench 56. After the formation of the intrinsic semiconductor region 67, the sacrificial oxide film 81 and the hard mask 82 are removed.

Figure 6F:
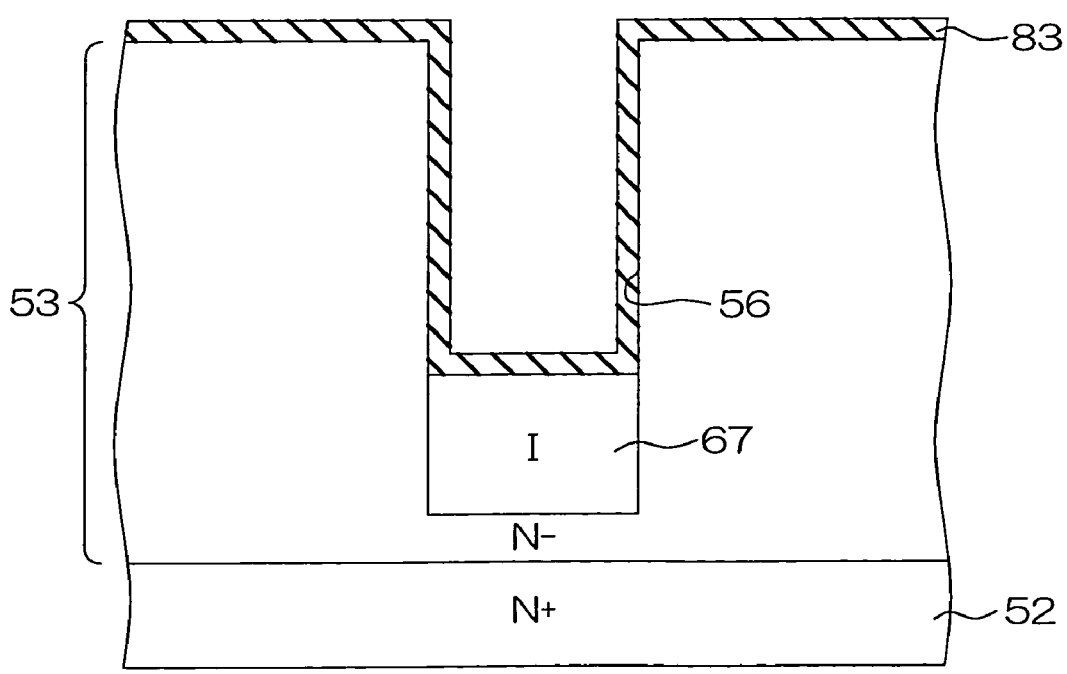

Then, thermal oxidation is so performed as to form an oxide film 83 made of $SiO_2$ on the overall surface of the epitaxial layer 53 including the inner surface of the gate trench 56, as shown in FIG. 6F (step of forming an oxide film).

Figure 6G:
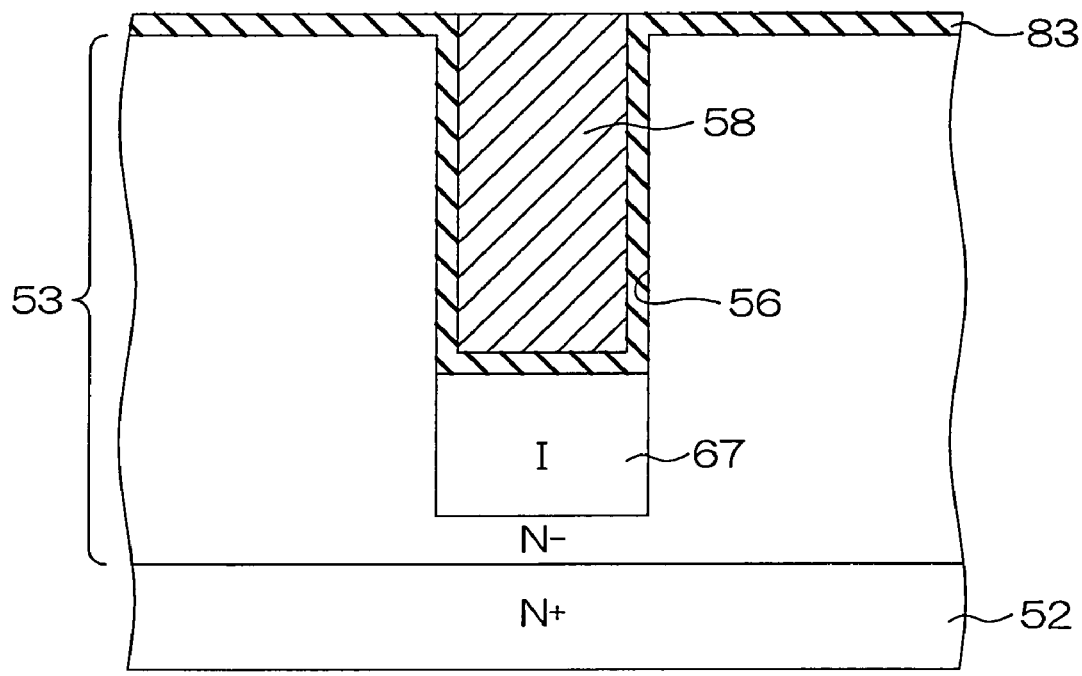

Then, a deposition layer of polysilicon doped with an N-type impurity in a high concentration is formed on the oxide film 83 by CVD. The gate trench 56 is filled up with the deposition layer of polysilicon. Then, a portion of the deposition layer of polysilicon located outside the gate trench 56 is removed by etching. Thus, the gate electrode 58 embedded in the gate trench 56 is obtained, as shown in FIG. 6G (step of forming a gate electrode).

Figure 6H:
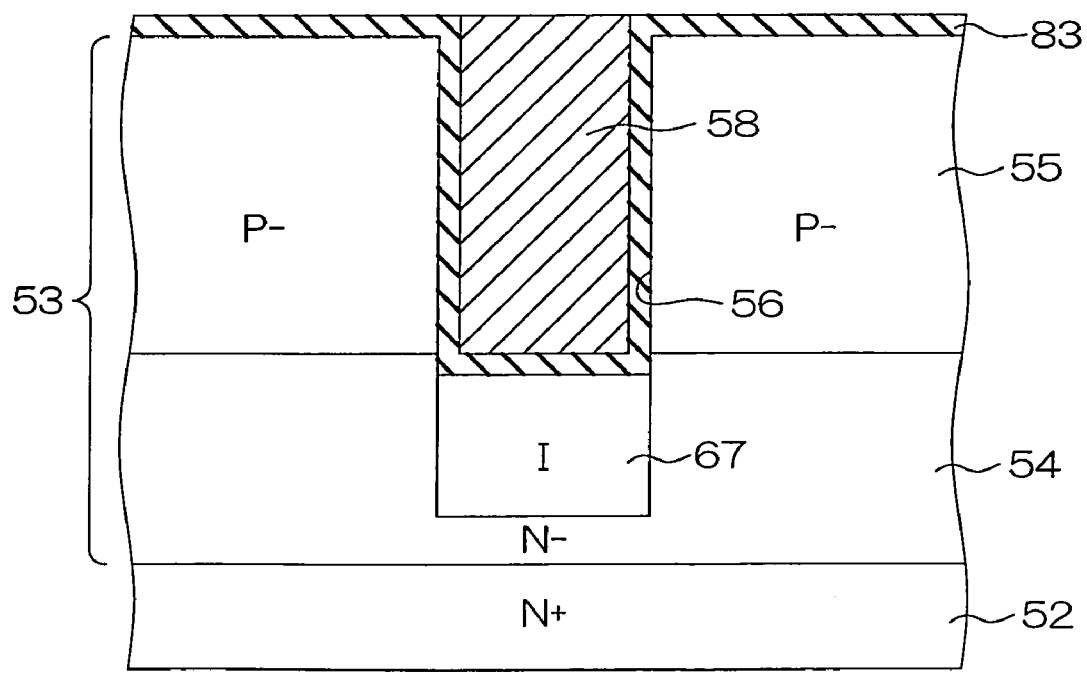

Thereafter ions of a P-type impurity are implanted into the epitaxial layer 53 from the surface of the oxide film 83. Then, drive-in diffusion is performed. The ions of the P-type impurity implanted into the epitaxial layer 53 are diffused due to this drive-in diffusion, and the body region 55 is formed in the epitaxial layer 53, as shown in FIG. 6H (step of forming a body region). Further, the remaining portion of the epitaxial layer 53 other than the body region 55 forms the N⁻-type region 54 in the state after the epitaxial growth.

Figure 6I:
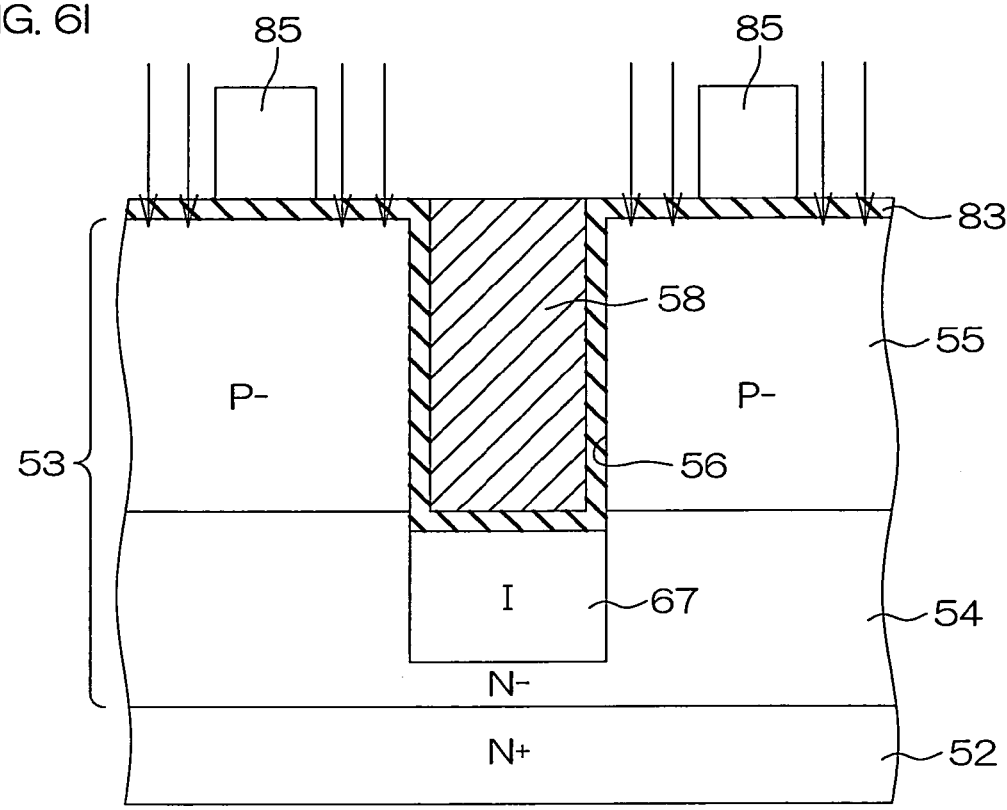

After the drive-in diffusion, a mask 85 having an opening in a portion opposed to the portion for forming the source region 59 is formed on the oxide film 83, as shown in FIG. 6I. Then, ions of an N-type impurity are implanted into the surface layer portion of the epitaxial layer 53 through the opening of the mask 85. After this ion implantation, the mask 85 is removed.

Figure 6J:
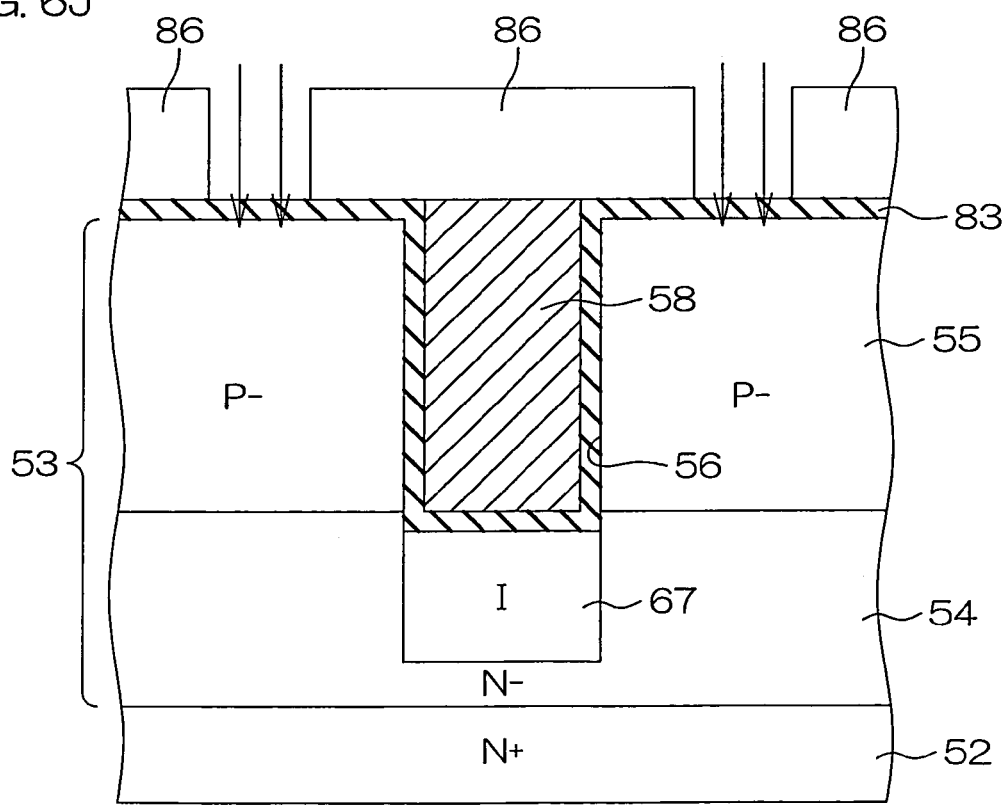

Further, another mask 86 having an opening in a portion opposed to the portion for forming the source contact region 60 is formed on the oxide film 83, as shown in FIG. 6J. Then, ions of a P-type impurity are implanted into the surface layer portion of the epitaxial layer 53 through the opening of the mask 86. After this ion implantation, the mask 86 is removed.

Figure 6K:
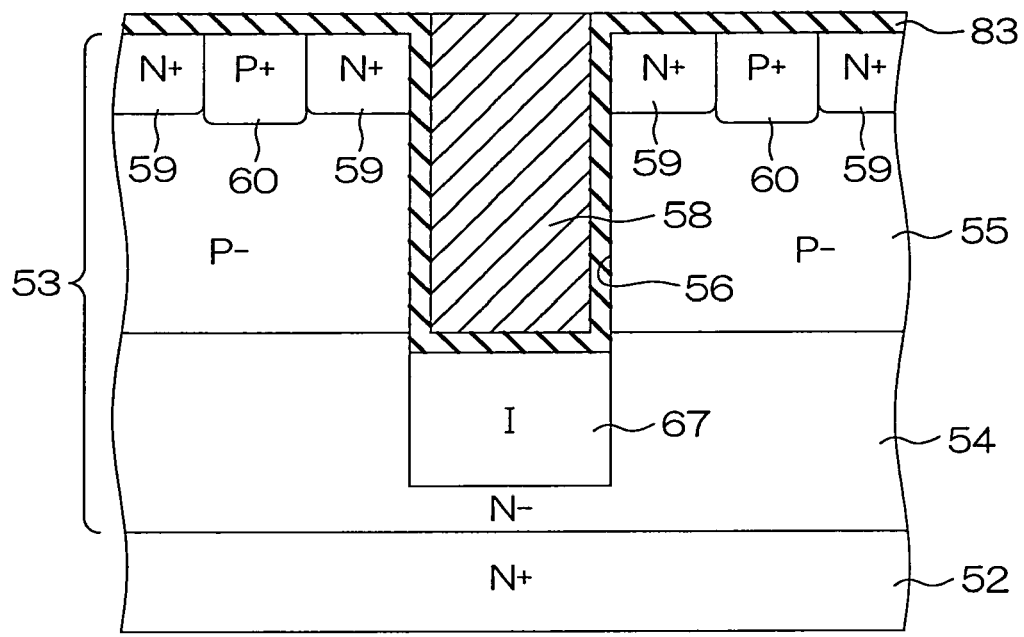

Thereafter annealing is performed. The ions of the N-type and P-type impurities implanted into the surface layer portion of the epitaxial layer 53 are activated due to this annealing, to form the source region 59 and the source contact region 60 on the surface layer portion of the epitaxial layer 53, as shown in FIG. 6K (step of forming a source region).

After the aforementioned steps, the gate insulating film 57 is obtained by removing a portion of the oxide film 83 located outside the gate trench 56 and leaving the oxide film 83 only on the inner surface of the gate trench 56.

Figure 6L:
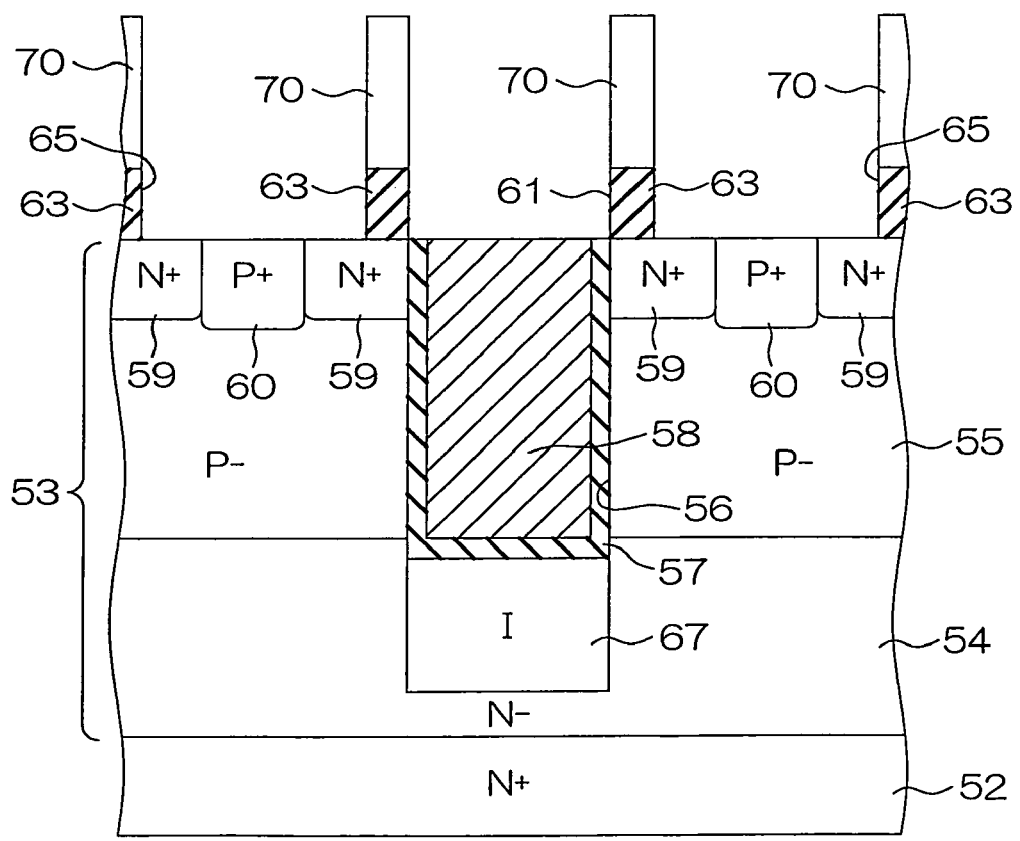

Thereafter $SiO_2$ is deposited on the epitaxial layer 53 by CVD. Then, a mask 70 having openings in portions opposed to the portions for forming the contact holes 61 and 65 respectively is formed on the deposited $SiO_2$, and $SiO_2$ is dry-etched through this mask 70. Thus, the interlayer dielectric film 63 having the contact holes 61 and 65 is formed, as shown in FIG. 6L.

Figure 6M:
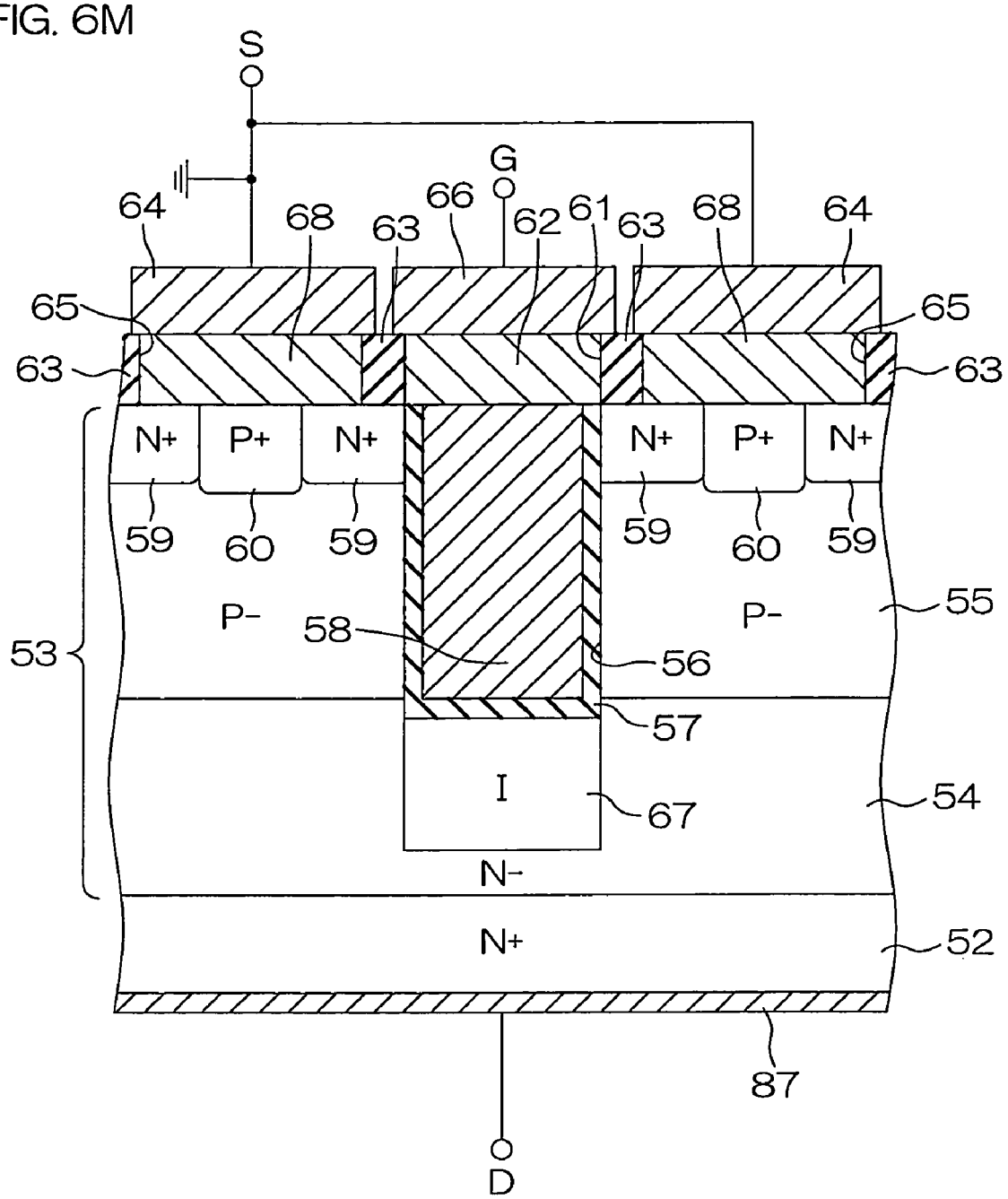

Then, the gate plug 62 is embedded in the contact hole 61 and the gate wire 66 is formed on the gate plug 62, while the source plug 68 is embedded in the contact hole 65 and the source wire 64 is formed on the source plug 68, as shown in FIG. 6M. Further, the drain electrode 87 is formed on the back surface of the N$^+$-type substrate 52. Thus, the semiconductor device 51 shown in FIG. 5 is obtained.

FIG. 7 is a schematic sectional view of a semiconductor device 91 according to a fourth embodiment of the present invention. Referring to FIG. 7, portions corresponding to those shown in FIG. 5 are denoted by the same reference numerals. Further, redundant description is omitted as to the portions having the same reference numerals as the above.

In this semiconductor device 91, a P$^-$-type impurity-containing region 84 (low-concentration region) is formed in an N$^-$-type region 54 of an epitaxial layer 53 on a portion reaching the bottom portion of the N$^-$-type region 54 (position separated from the upper surface of an N$^+$-type substrate 52 upward by a prescribed distance) from the bottom surface of a gate trench 56. The P$^-$-type impurity-containing region 84 is a region of the N$^-$-type region 54 containing a P-type impurity. In other words, the P$^-$-type impurity-containing region 84 is a region having a lower N-type impurity concentration than the remaining portion of the N$^-$-type region 54.

The P$^-$-type impurity-containing region 84 has a width $W_3$ equal to the width $W_1$ of the gate trench 56, for example. Further, the P$^-$-type impurity-containing region 84 preferably has an impurity concentration of $1 \times 10^{15}$ cm$^{-3}$ to $1 \times 10^{17}$ cm$^{-3}$ and a thickness $T_a$ of 1 μm to 10 μm, and preferably has an impurity concentration of $1 \times 10^{16}$ cm$^{-3}$ to $1 \times 10^{17}$ cm$^{-3}$ and a thickness $T_a$ of 1 μm to 5 μm, for example. More specifically, the P$^-$-type impurity-containing region 84 preferably has an impurity concentration of $1 \times 10^{16}$ cm$^{-3}$ and a thickness $T_a$ of 4 μm, and preferably has an impurity concentration of $1 \times 10^{17}$ cm$^{-3}$ and a thickness $T_a$ of 1 μm.

Also according to this structure, the P$^-$-type impurity-containing region 84 is formed on the portion of the epitaxial layer 53 reaching the bottom portion of the N$^-$-type region 54 from the bottom surface of the gate trench 56, whereby the thickness $T_{dep3}$ of a depletion layer 90 spreading from the interface between the N$^-$-type region 54 and a body region 55 can be more increased as compared with the conventional structure provided with the N$^-$-type region 103 having a uniform N-type impurity concentration. Consequently, a gate-to-drain voltage applied to a gate insulating film 57 upon voltage application to a drain electrode 87 can be reduced. Thus, the thickness of the gate insulating film 57 can be reduced, whereby channel resistance $R_{ch5}$ in a channel forming region 92 can be reduced, and the on-resistance $R_{on5}$ of the semiconductor device 91 can be reduced.

This semiconductor device 91 can be prepared by a method similar to that described with reference to FIGS. 6A to 6M. In order to manufacture the semiconductor device 91, the low-concentration material deposition layer 69 containing a P-type impurity may be formed by depositing Si on the epitaxial layer 53 while adding (doping) the P-type impurity in the step shown in FIG. 6C.

While a plurality of embodiments of the present invention have been described, the present invention may be embodied in other ways.

For example, the conductivity types of the semiconductor portions of the semiconductor devices 1, 31 and 51 may be reversed. In other words, the P-type portions may be converted to N-type portions and vice versa in the semiconductor devices 1, 31 and 51.

In the semiconductor device 31, the bottom portion 36 of the gate insulating film 35 may have a two-layer structure constituted of a lower layer film made of $SiO_2$ and an upper layer film made of SiN. In this case, the lower and upper layer films can be prepared by a method similar to that employed in the method of manufacturing the semiconductor device 1.

In the semiconductor device 51, the region formed on the portion reaching the bottom portion of the N$^-$-type region 54 (position separated from the upper surface of the N$^+$-type substrate 52 upward by the prescribed distance) from the bottom surface of the gate trench 56 may be an N$^{--}$-type semiconductor region, for example, so far as the same has a lower N-type impurity concentration than the remaining portion. In order to form the aforementioned N$^{--}$-type semiconductor region, Si having a lower N-type impurity concentration than the epitaxial layer 53 may be deposited on the epitaxial layer 53 in the step shown in FIG. 6C, for example.

Figure 8:
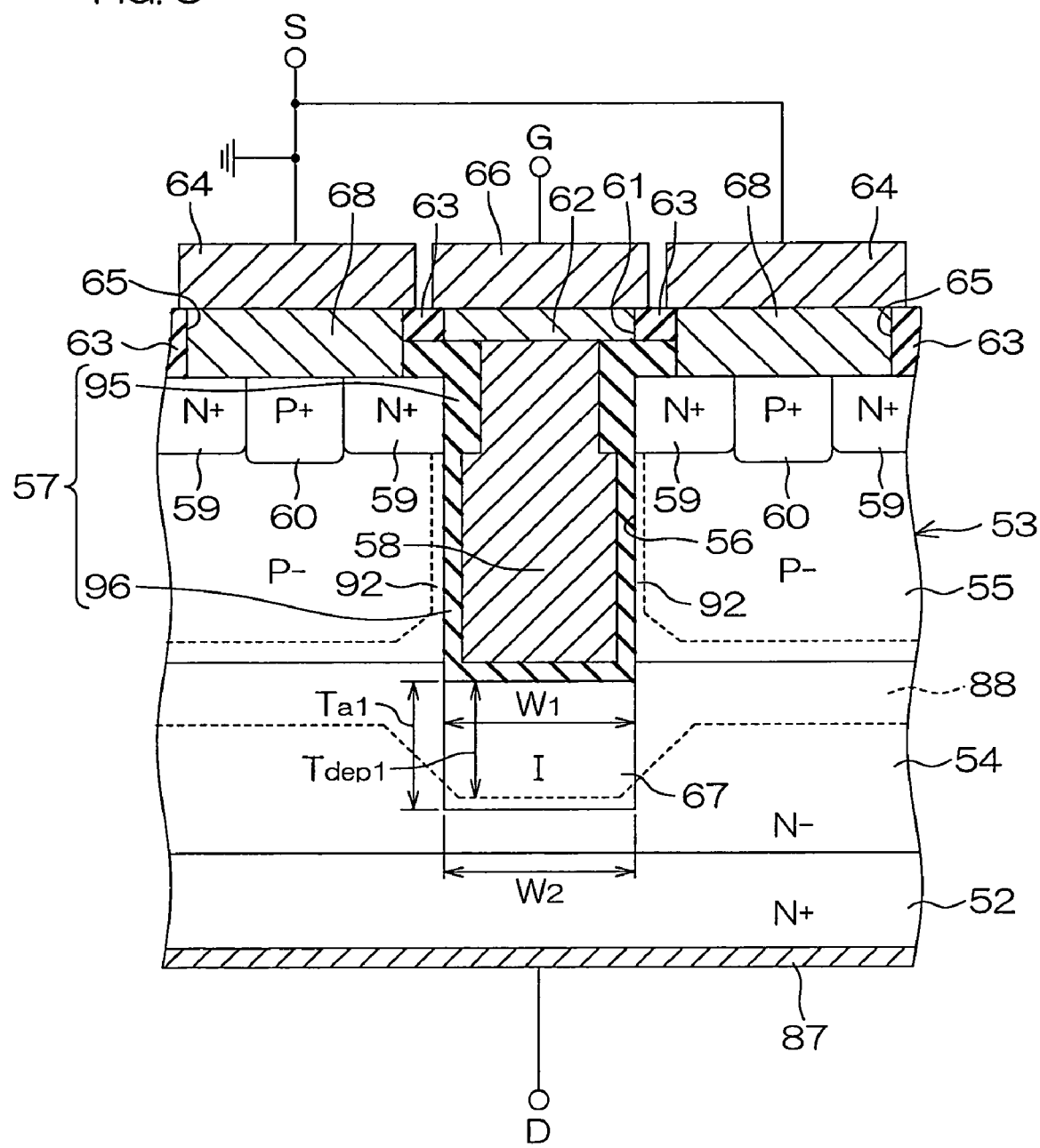
FIG. 8 is a schematic sectional view showing a modification of the semiconductor device shown in FIG. 5.

In the semiconductor device 51, the gate insulating film 57 may have a body region opposed portion 96 opposed to the body region 55 of the epitaxial layer 53 and a source region opposed portion 95 opposed to the source region 59 with a larger thickness than the body region opposed portion 96, as shown in FIG. 8, for example. In relation to this gate insulating film 57, the source region 59 and the body region 55 may be formed on the epitaxial layer 53 before the formation of the gate insulating film 57, as shown in the first embodiment, for example.

The source region 59 has a higher impurity concentration than the body region 55, and is oxidized at a higher rate of oxidation than the body region 55. Therefore, the gate insulating film 57 can be formed with the source region opposed portion 95 and the body region opposed portion 96 having thicknesses different from each other, as described above.

While the illustrative embodiments of the present invention are provided in the above description, such is for illustrative purpose only and it is not to be construed limitative. Modification and variation of the present invention that will be obvious to those skilled in the art is to be covered by the following claims.

The present application claims priority from Japanese Patent Application No. 2007-244408 filed on Sep. 20, 2007, Japanese Patent Application No. 2007-244409 filed on Sep. 20, 2007 and Japanese Patent Application No. 2008-220323 filed on Aug. 28, 2008 the content of which is hereby incorporated by reference into this application.

What is claimed is:

1. A semiconductor device comprising:
a drain layer of a first conductivity type;
a body layer of a second conductivity type formed on the drain layer, the body layer having a body region and a surface layer portion on the body region;
a gate trench passing through the body layer so that the deepest portion thereof reaches the drain layer;
a source region of the first conductivity type formed around the gate trench on the surface layer portion of the body layer;
a gate insulating film formed on a bottom surface and a side surface of the gate trench; and
a gate electrode embedded in the gate trench through the gate insulating film,
an upper portion of the gate electrode encompassed by the source region being thinner than a lower portion of the gate electrode encompassed by the body region of the body layer excluding the source region,
the bottom surface of the gate electrode and the upper surface of the drain layer being flush with each other, and
the thickness of a portion of the gate insulating film sandwiched between the upper portion of the gate electrode and the source region being larger than the thickness of a portion of the gate insulating film sandwiched between the lower portion of the gate electrode and the body region.

2. The semiconductor device according to claim 1, wherein the thickness of a portion of the gate insulating film covering the bottom surface of the gate trench is larger than the thickness of a portion of the gate insulating film opposed to the body layer on the side surface of the gate trench.

3. The semiconductor device according to claim 1, wherein an intermediate portion of the drain layer along a thickness direction from the bottom surface of the gate trench contains a second conductivity type impurity.

4. The semiconductor device according to claim 1, wherein a bottom portion of the gate insulating film in contact with the drain layer on the bottom surface of the gate trench and the side surface of the gate trench has a two-layer structure formed by successively laminating a lower layer film made of silicon oxide and an upper layer film made of silicon nitride.

5. A semiconductor device comprising:
a semiconductor layer having a drain region of a first conductivity type containing a first conductivity type impurity, and a body region of a second conductivity type formed on the drain region in contact with the drain region;
a trench formed in the semiconductor layer to pass through the body region so that the deepest portion thereof reaches the drain region;
a source region of the first conductivity type formed around the trench on the surface layer portion of the semiconductor layer in contact with the body region;
a gate insulating film formed on a bottom surface and a side surface of the trench; and
a gate electrode embedded in the trench through the gate insulating film, an upper portion of the gate electrode encompassed by the source region being thinner than a lower portion of the gate electrode encompassed by the body region,
a portion of the drain region reaching an intermediate portion of the drain region along the thickness direction from the bottom surface of the trench being a low-concentration region having a lower first conductivity type impurity concentration than the remaining portion of the drain region, and
the thickness of a portion of the gate insulating film sandwiched between the upper portion of the gate electrode and the source region being larger than the thickness of a portion of the gate insulating film sandwiched between the lower portion of the gate electrode and the body region.

6. The semiconductor device according to claim 5, wherein the low-concentration region contains a second conductivity type impurity.

7. The semiconductor device according to claim 5, wherein the low-concentration region is made of an intrinsic semiconductor containing no impurity.

* * * * *